United States Patent
Matsukawa

(10) Patent No.: US 12,282,072 B2
(45) Date of Patent: Apr. 22, 2025

(54) BATTERY MONITORING DEVICE

(71) Applicant: DENSO CORPORATION, Kariya (JP)

(72) Inventor: Kazuo Matsukawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 210 days.

(21) Appl. No.: 18/301,448

(22) Filed: Apr. 17, 2023

(65) Prior Publication Data

US 2023/0314529 A1    Oct. 5, 2023

Related U.S. Application Data

(63) Continuation of application No. PCT/JP2021/046290, filed on Dec. 15, 2021.

(30) Foreign Application Priority Data

Dec. 16, 2020  (JP) ................................. 2020-208507

(51) Int. Cl.
| | |
|---|---|
| *G01R 31/396* | (2019.01) |
| *G01R 31/3842* | (2019.01) |
| *G01R 31/389* | (2019.01) |
| *H01M 10/42* | (2006.01) |
| *H01M 10/48* | (2006.01) |
| *H02J 7/00* | (2006.01) |

(52) U.S. Cl.
CPC ....... *G01R 31/396* (2019.01); *G01R 31/3842* (2019.01); *G01R 31/389* (2019.01); *H01M 10/4264* (2013.01); *H01M 10/482* (2013.01); *H02J 7/0047* (2013.01)

(58) Field of Classification Search
CPC  G01R 31/396; G01R 31/3842; G01R 31/389; H01M 10/4264; H01M 10/482; H02J 7/0047
See application file for complete search history.

(56) References Cited

U.S. PATENT DOCUMENTS

| | | | |
|---|---|---|---|
| 6,368,746 B1 * | 4/2002 | Takada ................. | H01M 4/621 429/208 |
| 2012/0105070 A1 * | 5/2012 | van Lammeren .... | G01R 31/389 324/430 |
| 2021/0109160 A1 | 4/2021 | Matsukawa et al. | |
| 2021/0109162 A1 | 4/2021 | Matsukawa et al. | |
| 2022/0373602 A1 * | 11/2022 | Kitagawa ................. | H02J 7/00 |

FOREIGN PATENT DOCUMENTS

| | | |
|---|---|---|
| JP | 2013-064697 A | 4/2013 |
| JP | 6035028 B2 | 11/2016 |
| JP | 2022095275 A * | 6/2022 |

* cited by examiner

*Primary Examiner* — Christopher E Mahoney
(74) *Attorney, Agent, or Firm* — Posz Law Group, PLC

(57) ABSTRACT

A current application unit includes a load element, a switching element, and a shunt resistor connected in series between both terminals of an assembled battery, and a drive control unit of the switching element to apply an alternating current having a predetermined frequency to the assembled battery. The drive control unit includes: a PWM modulator for generating a drive signal; a PDM modulator for generating the drive signal; and a switching unit for switching between a first drive state for driving the switching element by the drive signal generated by the PWM modulator and a second drive state for driving the switching element by the drive signal generated by the PDM modulator.

11 Claims, 12 Drawing Sheets

| | PWM | |
|---|---|---|
| MAX MAIN SIG AMPL | $4/\pi \approx 1.273$ | 1 |
| REDUCE DC CUR | PUL W CHA NEEDED | EASILY REALIZABLE BY CHANGING DC COMP OF AC SIG ETC |
| FREQ SPEC | <DUTY RATIO IS 50%> ONLY ODD HARM GENE  <DUTY RATIO IS LESS THAN 50%> EVEN HARM AND ODD HARM GENE | EXTREMELY SMALL HARM |

BATTERY MONITORING DEVICE

CROSS REFERENCE TO RELATED APPLICATIONS

The present application is a continuation application of International Patent Application No. PCT/JP2021/046290 filed on Dec. 15, 2021, which designated the U.S. and claims the benefit of priority from Japanese Patent Application No. 2020-208507 filed on Dec. 16, 2020. The entire disclosures of all of the above applications are incorporated herein by reference.

TECHNICAL FIELD

The present disclosure relates to a battery monitoring device for monitoring an assembled battery in which a plurality of battery cells are connected in series.

BACKGROUND

The battery monitoring device has a function of estimating the SOC of each battery cell, a function of estimating the state of deterioration of each battery cell, a function of equalizing the voltage of each battery cell, and the like. Note that SOC is an index representing the state of charge of the battery, and is an abbreviation for State Of Charge. In order to realize these functions, the battery monitoring device is provided with a voltage detection unit that detects the voltage of the battery cell. The deterioration state of the battery cell described above can be estimated by the AC impedance method.

SUMMARY

According to an example, a current application unit may include a load element, a switching element, and a shunt resistor connected in series between both terminals of an assembled battery, and a drive control unit of the switching element to apply an alternating current having a predetermined frequency to the assembled battery. The drive control unit includes: a PWM modulator for generating a drive signal; a PDM modulator for generating the drive signal; and a switching unit for switching between a first drive state for driving the switching element by the drive signal generated by the PWM modulator and a second drive state for driving the switching element by the drive signal generated by the PDM modulator.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
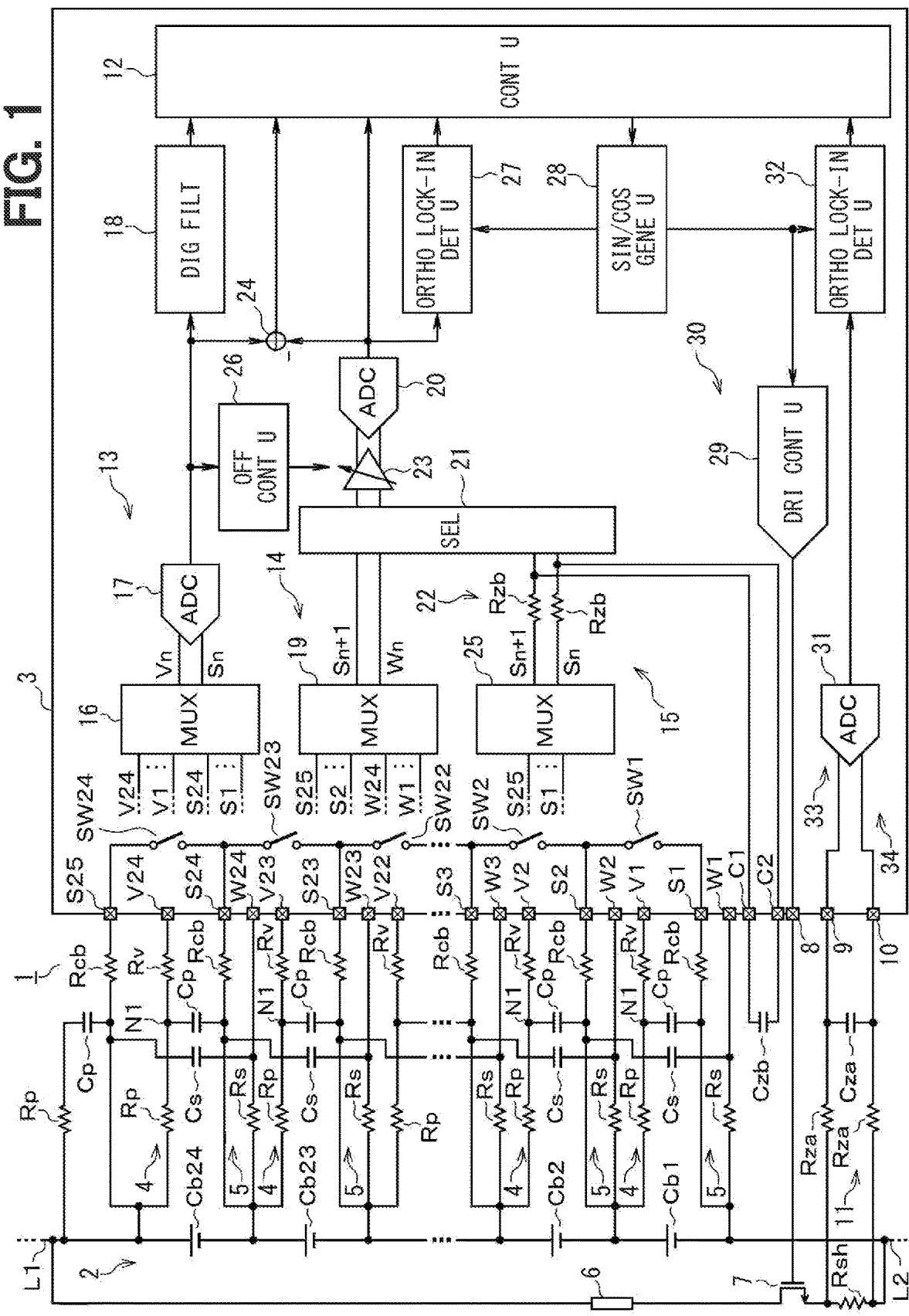
FIG. 1 is a diagram schematically showing the configuration of a battery monitoring device according to a first embodiment.

In the AC impedance method, the current flowing through the battery cells is detected when an alternating current having a frequency of, for example, about 10 Hz to 5 kHz is applied between the terminals of the assembled battery, and the impedance at each frequency is calculated based on the detected value of the current and the detected value of the voltage of the battery cell, and the state of deterioration of the battery cell is estimated based on the impedance for each frequency. Therefore, according to a conceivable technique, a battery monitoring device includes a current applying unit configured to apply an alternating current between terminals of an assembled battery, and a current detection unit for detecting the current flowing through the battery cell, and the like.

As a specific configuration example of the current applying unit in the battery monitoring device according to a conceivable technique, the configuration may provide a load element and a switching element connected in series between both terminals of the assembled battery, and a drive control unit that controls driving of the switching element so that the AC current is applied to the assembled battery. In this case, the drive signal for driving the switching element is generally generated by pulse width modulating an AC signal having a desired frequency.

However, with such a configuration, especially during low-frequency measurement where the frequency of the alternating current is relatively low, the pulses of the drive signal may be easily concentrated in terms of time. As a result, temporal concentration of heat may occur at the load element, the switching element and the like. Such temporal concentration of heat generation may cause a difficulty such as a decrease in operational safety, a difficulty such as an impedance measurement error caused by a characteristic change due to the temperature of the load element, and the like.

An object of the present embodiments is to provide a battery monitoring device that performs redundant monitoring of battery cell voltage detection and that maintains operational safety and calculation accuracy in impedance calculation.

In one aspect of the present embodiments, a battery monitoring device monitors an assembled battery having a configuration in which a plurality of battery cells are connected in series, and includes: a first voltage detection unit that detects voltages of the plurality of battery cells; a second voltage detection unit that detects the voltages of a plurality of battery cells for redundant monitoring; a current application unit that applies an alternating current to the assembled battery; and a third voltage detection unit that detects the voltages of the battery cells in a period when the current application unit applies the alternating current to the assembled battery; and a calculation unit that calculates the impedances of the battery cells.

The current application unit includes a load element, a switching element, and a shunt resistor connected in series between both terminals of the assembled battery, and a drive control unit that controls driving of the switching element so that an alternating current having a predetermined frequency is applied to the assembled battery. The calculation unit includes a current detection unit that detects the current flowing through the plurality of battery cells based on the terminal voltage of the shunt resistor, and calculates the impedance based on the current values of the plurality of battery cells detected by the current detection unit and the voltage values of the plurality of battery cells detected by the third voltage detection unit. The drive control unit includes a PWM modulator, a PDM modulator and a switching unit.

A PWM modulator generates a drive signal for driving a switching element by pulse-width modulating an AC signal having a predetermined frequency. A PDM modulator generates a drive signal by pulse-density modulating an AC signal having a predetermined frequency. The switching unit switches between a first drive state in which the switching element is driven by the drive signal generated by the PWM modulator and a second drive state in which the switching element is driven by the drive signal generated by the PDM modulator.

According to such a configuration, since the second voltage detection unit is provided in addition to the first voltage detection unit as a configuration for detecting the voltages of the plurality of battery cells, it is possible to redundantly monitor the voltages of the battery cells. Further, in the above configuration, when an alternating current is passed through the assembled battery for impedance calculation, it is possible to select one of the first drive state in which the switching element is driven by a drive signal generated by pulse width modulating the alternating signal and the second drive state in which the switching element is driven by a drive signal generated by pulse density modulating the alternating signal.

When the drive signal is generated by pulse-density modulating the AC signal, it becomes difficult for the pulses of the drive signal to converge in terms of time during low-frequency measurement. Therefore, in the above configuration, by selecting the second drive state during low-frequency measurement, it is possible to avoid the temporal concentration of pulses of the drive signal and thus to avoid the temporal concentration of heat generation. As a result, an excellent effect can be obtained in that the safety and calculation accuracy of the impedance calculation can be maintained satisfactorily.

In one aspect of the present embodiments, the current detection unit includes an A/D converter that A/D converts the terminal voltage of the shunt resistor, and a orthogonal lock-in detection unit. The orthogonal lock-in detection unit multiplies the digital signal output from the A/D converter by a SIN wave signal and a COS wave signal having the same frequency as the AC signal, respectively, thereby generating two post-multiplication signals, and detects the real part and imaginary part of the signal corresponding to the detected value of the current flowing through the plurality of battery cells by integrating each of these two post multiplication signals through an integration filter.

The drive signal includes harmonic components because it is a rectangular wave signal generated by either the PWM modulator or the PDM modulator. The harmonic components included in such a drive signal may lead to a detection error in the orthogonal lock-in detection unit. Therefore, in the above configuration, the operation period of the integration filter is an integer multiple period of the AC signal. By doing so, it becomes possible to match the harmonic component with the notch of the integration filter, and a large attenuation characteristic can be obtained. Therefore, according to the above configuration, it is possible to greatly attenuate the harmonic components of the drive signal that may cause a detection error, so that the S/N ratio of detection by the orthogonal lock-in detection unit can be improved.

Hereinafter, multiple embodiments will be described with reference to the drawings. In each embodiment, the substantially same components are denoted by the same reference numerals and description thereof will be omitted.

First Embodiment

The following will describe a first embodiment with reference to FIG. 1 to FIG. 8.
<Overall Configuration>

As shown in FIG. 1, the battery monitoring device 1 of the present embodiment includes a battery monitoring IC 3 as a device that monitors the state of the assembled battery 2 by detecting various states such as the voltage of the assembled battery 2 and is provided by an integrated circuit in which a circuit for performing various operations for battery monitoring is integrated, and a plurality of external elements provided outside the battery monitoring IC 3. IC is an abbreviation for integrated circuit. The assembled battery 2 is mounted in a vehicle such as an automobile, for example, and has a configuration in which a plurality of, for example, 24 battery cells Cb are connected in series in multiple stages between a pair of DC power supply lines L1 and L2.

In this case, the battery cell Cb is, for example, a secondary battery such as a lithium ion battery, a fuel cell, or the like. In addition, in FIG. 1, four battery cells Cb out of the 24 battery cells Cb are shown, and in order to distinguish these four battery cells Cb, numerals are attached to the end of the reference numerals. This number corresponds to the arrangement of the battery cells Cb in the assembled battery 2, with 1 being given to the battery cell Cb arranged on the lowest potential side, and with 2, 3, 4 and so on being given as it progresses toward the higher potential side, and with 24 being given to the battery cell Cb arranged on the highest potential side.

Therefore, in FIG. 1, a battery cell Cb1 arranged on the lowest potential side, a battery cell Cb2 arranged on the second low potential side, a battery cell Cb23 arranged on the second high potential side, and a battery cell Cb24 arranged on the highest potential side are shown. Each component provided in the battery monitoring device 1 corresponding to each of these four battery cells Cb1, Cb2, Cb23, and Cb24 may also be distinguished by adding the same number at the end of the reference numeral. Here, in a case where there is no need to distinguish these configurations, the respective configurations will be collectively referred to by omitting the numbers at the ends.

<Structure of External Element>

First, the configuration of external elements provided outside the battery monitoring IC 3 will be described. The high potential side terminal of the battery cell Cb24 is connected to the connection terminal S25 via the discharge resistor Rcb, and is also connected to the connection terminal V24 via the resistors Rp and Rv. A resistor Rp and a capacitor Cp are connected in series between the high potential side terminal of the battery cell Cb24 and the resistor Rcb. The low potential side terminal of the battery cell Cb24 and the high potential side terminal of the battery cell Cb23 are connected to the connection terminal S24 via the resistor Rcb and connected to the connection terminal W24 via the resistor Rs.

The low potential side terminal of the battery cell Cb24 and the high potential side terminal of the battery cell Cb23 are connected to the connection terminal V23 via the resistor Rp and the resistor Rv. A capacitor Cs is connected between the high potential side terminal of the battery cell Cb24 and the connection terminal W24. A capacitor Cp is connected between the low potential side terminal of the battery cell Cb24 and a node N1 that is a common connection node of the resistors Rp and Rv.

The low potential side terminal of the battery cell Cb23 and the high potential side terminal (not shown) of the battery cell Cb22 are connected to the connection terminal S23 via the resistor Rcb and connected to the connection terminal W23 via the resistor Rs. The low potential side terminal of the battery cell Cb23 and the high potential side terminal of the battery cell Cb22 are connected to the connection terminal V22 via the resistor Rp and the resistor Rv. A capacitor Cs is connected between the high potential side terminal of the battery cell Cb23 and the connection terminal W23. A capacitor Cp is connected between the low potential side terminal of the battery cell Cb23 and a node N1 that is a common connection node of the resistors Rp and Rv.

The low potential side terminal (not shown) of the battery cell Cb3 and the high potential side terminal of the battery cell Cb2 are connected to the connection terminal S3 via the resistor Rcb and connected to the connection terminal W3 via the resistor Rs. The low potential side terminal of the battery cell Cb3 and the high potential side terminal of the battery cell Cb2 are connected to the connection terminal V2 via the resistor Rp and the resistor Rv. The low potential side terminal of the battery cell Cb2 and the high potential side terminal of the battery cell Cb1 are connected to the connection terminal S2 via the resistor Rcb and connected to the connection terminal W2 via the resistor Rs.

The low potential side terminal of the battery cell Cb2 and the high potential side terminal of the battery cell Cb1 are connected to the connection terminal V1 via the resistor Rp and the resistor Rv. A capacitor Cs is connected between the high potential side terminal of the battery cell Cb2 and the connection terminal W2. A capacitor Cp is connected between the low potential side terminal of the battery cell Cb2 and a node N1 that is a common connection node of the resistors Rp and Rv.

A low-potential terminal of the battery cell Cb1 is connected to the connection terminal S1 via the resistor Rcb, and is connected to the connection terminal W1 via the resistor Rs. A capacitor Cs is connected between the high potential side terminal of the battery cell Cb1 and the connection terminal W1. A capacitor Cp is connected between the low potential side terminal of the battery cell Cb1 and a node N1 that is a common connection node of the resistors Rp and Rv.

In the above configuration, the connection terminals S1 to S24 are provided corresponding to each of the plurality of battery cells Cb, and function as first connection terminals connected to the low-potential terminal of the battery cell Cb via the resistor Rcb. A resistor Rcb is a discharging resistor for discharging the battery cell Cb during equalization. Since the resistor Rcb functions as a current limiting resistor during equalization, its resistance value is smaller than the resistance values of the other resistors, specifically about several tens of ohms. The connection terminal S25 functions as a second connection terminal that is connected to the high potential side terminal of the battery cell Cb24, which is the highest stage battery cell provided on the highest potential side in the assembled battery 2, via the resistor Rcb.

The connection terminal V is provided corresponding to each of the plurality of battery cells Cb, and functions as a third connection terminal connected to the high potential side terminal of the battery cell Cb via the resistor Rp. The resistor Rp functions as a first filter resistor provided corresponding to each of the plurality of battery cells Cb. The capacitor Cp is provided corresponding to each of the plurality of battery cells Cb, and functions as a first filter capacitor that is connected between the connection terminal S connected to the corresponding battery cell Cb and the connection terminal V connected to the corresponding battery cell Cb. In this case, the resistor Rp and the capacitor Cp constitute the filter 4, which is a so-called L-type LPF. That is, in this case, the filters 4 are provided so as to correspond to each of the plurality of battery cells Cb.

The connection terminal W is provided corresponding to each of the plurality of battery cells Cb, and functions as a fourth connection terminal connected to the low potential side terminal of the battery cell Cb via the resistor Rs. The resistor Rs functions as a second filter resistor provided corresponding to each of the plurality of battery cells Cb. The capacity Cs functions as a second filter capacitor Cs provided corresponding to each of the plurality of battery cells Cb.

The capacitor Cs corresponding to the battery cells Cb1 to Cb23 other than the highest stage battery cell is connected between the connection terminal S connected to the battery cell Cb adjacent to the upper stage side of the corresponding battery cell Cb, and the connection terminal W connected to the corresponding battery cell Cb. A capacitor Cs corresponding to the battery cell Cb24, which is the highest stage battery cell, is connected between the connection terminal S25 and the connection terminal W24 connected to the battery cell Cb24. In this case, the resistor Rs and the capacitor Cs constitute the filter 5, which is a so-called L-type LPF. That is, in this case, the filters 5 are provided so as to correspond to each of the plurality of battery cells Cb.

A load element 6, a switching element 7, which is an N-channel MOS transistor, and a shunt resistor Rsh are connected in series between the DC power supply lines L1 and L2, that is, between both terminals of the assembled battery 2. One terminal of the load element 6 is connected to the direct current power supply line L1, and the other terminal of the load element 6 is connected to a drain of the switching element 7. A source of the switching element 7 is connected to the DC power supply line L2 via a shunt resistor Rsh. A gate of the switching element 7 is connected to the terminal 8. In this case, the load element 6 is constructed by using a PTC heater for warming the battery cell Cb.

Each terminal to the shunt resistor Rsh is connected to the terminals 9 and 10 via the resistor Rza, respectively. The capacitor Cza is connected between the terminals 9 and 10. Two resistors Rza and the capacitors Cza constitute a filter 11 as a pi type LPF. A capacitor Czb is connected between terminals C1 and C2 for connecting an external capacitor.

<Internal Configuration of Battery Monitoring IC>

Next, the internal configuration of the battery monitoring IC 3 will be described. An equalization switch SW is provided corresponding to each of the plurality of battery cells Cb. The equalization switch SW includes, for example, a MOS transistor, and constitutes a discharge circuit together with the resistor Rcb. On/off of the equalization switch is controlled by the control unit 12. The control unit 12 includes a communication I/F for communication with the outside, a register for storing various data, and the like, and controls the overall operation of the battery monitoring IC 3. Note that I/F is an abbreviation for interface. In the equalization process, the operation of each discharge circuit is controlled so that the voltage of each battery cell Cb is approximately the same as the voltage of the lowest battery cell Cb.

A specific connection form of the equalization switch SW is described as follows. That is, the equalization switch SW24 corresponding to the battery cell Cb24 is connected between the connection terminal S25 and the connection terminal S24. The equalization switch SW23 corresponding to the battery cell Cb23 is connected between the connection terminal S24 and the connection terminal S23. The equalization switch SW22 corresponding to the battery cell Cb22 (not shown) is connected between the connection terminal S23 and the connection terminal S22 (not shown). The equalization switch SW2 corresponding to the battery cell Cb2 is connected between the connection terminal S3 and the connection terminal S2. The equalization switch SW1 corresponding to the battery cell Cb1 is connected between the connection terminal S2 and the connection terminal S1.

The battery monitoring IC 3 includes three voltage detectors, that are a first voltage detector 13, a second voltage detector 14, and a third voltage detector 15, all of which detect voltages of a plurality of battery cells Cb. The first voltage detection unit 13 and the second voltage detection unit 14 perform voltage measurement in order to estimate the SOC of each battery cell Cb, perform equalization processing, and the like. That is, in this case, the configuration for performing voltage measurement in order to perform SOC estimation, equalization processing, and the like is made redundant.

The first voltage detection unit 13 performs main measurement and includes a multiplexer 16 and an A/D converter 17. The first voltage detection unit 13 detects a voltage via the connection terminals S1 to S24 and the connection terminals V1 to V24 corresponding to the battery cell Cb as a detection target. In order to realize such a detection operation, the first voltage detection unit 13 has the following configuration. That is, the multiplexer 16 receives the voltages of the connection terminals S1 to S24 and the connection terminals V1 to V24, and selects and outputs two voltages necessary for detecting the voltage of the battery cell Cb as the detection target among the input voltages. In this specification, a multiplexer may be abbreviated as MUX.

Specifically, the MUX 16 performs the following selection operations. In other words, the MUX 16 selects and outputs the voltage of the connection terminal Vn and the voltage of the connection terminal Sn when the number added to the end of the battery cell Cb as the detection target is generalized as n. For example, when the detection target is the battery cell Cb24, the voltages of the connection terminals V24 and S24 are output, and when the detection target is the battery cell Cb23, the voltages of the connection terminals V23 and S23 are output, when the detection target is the battery cell Cb2, the voltages of the connection terminals V2 and S2 are output, and when the detection target is the battery cell Cb1, the voltages of the connection terminals V1 and S1 are output.

The A/D converter 17 A/D-converts the voltage output from the MUX 16 and outputs a digital signal obtained as a result of the conversion. In this specification, the A/D converter may be abbreviated as ADC. The digital signal output from the ADC 17 is a signal representing the voltage detection result by the first voltage detection unit 13 and is provided to the digital filter 18. The digital filter 18 functions as an LPF that receives the digital signal output from the ADC 17 and removes its high frequency components.

Although the digital filter 18 may cause folding noise like a general digital filter, the folding is suppressed by the function of the above-described filter 4 or the like as an anti-aliasing filter. The cutoff frequency of the digital filter 18 may be set to any value according to the frequency of noise generated in the battery cell Cb. An output signal of the digital filter 18 is given to the control unit 12. The control unit 12 acquires the detected value of the voltage of each battery cell Cb based on the output signal of the digital filter 18. The voltage detection operation by the first voltage detection unit 13 configured as described above is always performed.

The second voltage detection unit 14 performs secondary measurement for redundant monitoring, and includes an MUX 19 and an ADC 20. For the battery cells Cb1 to Cb23 excluding the battery cell Cb24 which is the highest stage battery cell, the second voltage detection unit 14 detects the voltage through the connection terminal S corresponding to the battery cell Cb adjacent to the upper stage side of the battery cell Cb as the detection target and the connection terminal W corresponding to the target battery cell Cb. The second voltage detection unit 14 detects the voltage of the battery cell Cb24, which is the highest stage battery cell, via the connection terminal S25 and the connection terminal W24 corresponding to the battery cell Cb24. In order to realize such a detection operation, the second voltage detection unit 14 has the following configuration.

That is, the multiplexer 19 receives the voltages of the connection terminals S2 to S25 and the connection terminals W1 to W24, and selects and outputs two voltages necessary for detecting the voltage of the battery cell Cb as the detection target among the input voltages. Specifically, the MUX 19 performs the following selection operations. In other words, the MUX 19 selects and outputs the voltage of the connection terminal Sn+1 and the voltage of the connection terminal Wn when the number added to the end of the battery cell Cb as the detection target is generalized as n.

For example, when the detection target is the battery cell Cb24, the voltages of the connection terminals S25 and W24 are output, and when the detection target is the battery cell Cb23, the voltages of the connection terminals S24 and W23 are output, when the detection target is the battery cell Cb2, the voltages of the connection terminals S3 and W2 are output, and when the detection target is the battery cell Cb1, the voltages of the connection terminals S2 and W1 are output.

A voltage output from the MUX 19 is input to the selector 21. The selector 21 also receives an output voltage of a filter 22 included in a third voltage detection unit 15, which will be described later. The selector 21 selects and outputs the voltage output from the MUX 19 of the second voltage detection unit 14 during the period when the detection operation by the second voltage detection unit 14 is performed, and selects and outputs the output voltage of the filter 22 of the third voltage detection unit 15 during the period when the detection operation by the third voltage detection unit 15 is performed.

A voltage output from the selector 21 is input to an amplifier 23 included in a third voltage detection unit 15, which will be described later. The amplifier 23 is, for example, a gain amplifier, and has a configuration in which the offset and the gain can be switched and set. In the amplifier 23, the offset is set to "0" and the gain is set to "1" while the second voltage detection unit 14 is performing the detection operation.

The ADC 20 A/D-converts the voltage output from the amplifier 23 and outputs a digital signal obtained as a result of the conversion. A digital signal output from the ADC 20 is provided to the control unit 12. The control unit 12 acquires the voltage detection value of each battery cell Cb based on the digital signal output from the ADC 20. The voltage detection operation by the second voltage detection unit 14 configured as described above is performed intermittently.

A digital signal output from the ADC 17 of the first voltage detection unit 13 and a digital signal output from the ADC 20 of the second voltage detection unit 14 are input to the subtractor 24. The subtractor 24 outputs a signal representing a value obtained by subtracting the digital value represented by the digital signal output from the ADC 20 from the digital value represented by the digital signal output from the ADC 17. The output signal of the subtractor 24 is a signal representing an error voltage corresponding to the difference between the voltage detected by the first voltage detection unit 13 and the voltage detected by the second voltage detection unit 14. The output signal of the subtractor 24 is given to the control unit 12. Based on the output signal of the subtractor 24, the control unit 12 diagnoses a failure related to the configuration for performing voltage measurement in order to perform SOC estimation, equalization processing, and the like.

The third voltage detection unit 15 performs voltage measurement to estimate the state of deterioration of each battery cell Cb, that is, to calculate the impedance of each battery cell Cb, and detects the voltages of the plurality of battery cells Cb during the period when the alternating current is applied to the assembled battery 2, which will be described later. The third voltage detection unit 15 includes an MUX 25, a filter 22, an amplifier 23, an offset control unit 26 and an ADC 20. In this case, the ADC 20 is shared with the second voltage detection unit 14. For the battery cells Cb1 to Cb23 excluding the battery cell Cb24 which is the highest stage battery cell, the third voltage detection unit 15 detects the voltage through the connection terminal S corresponding to the battery cell Cb adjacent to the upper stage side of the battery cell Cb as the detection target and the connection terminal S corresponding to the target battery cell Cb.

The third voltage detection unit 15 detects the voltage of the battery cell Cb24, which is the highest stage battery cell, via the connection terminal S25 and the connection terminal S24 corresponding to the battery cell Cb24. In order to realize such a detection operation, the third voltage detection unit 15 has the following configuration. That is, the multiplexer 25 receives the voltages of the connection terminals S1 to S25, and selects and outputs two voltages necessary for detecting the voltage of the battery cell Cb as the detection target among the input voltages. Specifically, the MUX 25 performs the following selection operations.

In other words, the MUX 25 selects and outputs the voltage of the connection terminal Sn+1 and the voltage of the connection terminal Sn when the number added to the end of the battery cell Cb as the detection target is generalized as n. For example, when the detection target is the battery cell Cb24, the voltages of the connection terminals S25 and S24 are output, and when the detection target is the battery cell Cb23, the voltages of the connection terminals S24 and S23 are output, when the detection target is the battery cell Cb2, the voltages of the connection terminals S3 and S2 are output, and when the detection target is the battery cell Cb1, the voltages of the connection terminals S2 and S1 are output.

Each output terminal of the MUX 25 is connected to each input terminal of the selector 21 via a resistor Rzb. Between the input terminals of the selector 21, the capacitor Czb, which is an external element, is connected. Two resistors Rza and the capacitor Cza constitute a filter 22 as a pi type LPF. It may be desirable that the resistors Rza and Rzb have the same resistance value, and the capacitors Cza and Czb have the same electrostatic capacitance value. Even if these resistance values are not the same, or even if these electrostatic capacitance values are not the same, the circuit constant of each element is designed so that the product of the resistance of the resistor Rza and the capacitance of the capacitor Cza is equal to the product of the resistance of the resistor Rzb and the capacitance of the capacitor Czb. According to these desirable circuit constant selection method and the second desirable circuit constant selection method, the cutoff frequencies of filters 11 and 22 can be made the same. If the product of resistance and capacitance cannot be made equal, it may be desirable to measure the characteristics of each of the voltage measurement system and the current measurement system and make corrections based on the measurement results. Thus, the output voltage of MUX 25 is input to filter 22 having resistor Rzb and capacitor Czb. The output voltage of filter 22 is input to selector 21.

The amplifier 23 connected to the rear stage of the selector 21 inputs the output voltage of the filter 22 while the detection operation is performed by the third voltage detection unit 15, adds an offset to the input voltage, and amplifies it. The amplification factor of the amplifier 23 and the amount of offset given by the amplifier 23 are controlled by the offset control unit 26. A digital signal output from the ADC 17 is given to the offset control unit 26.

The offset control unit 26 controls the amplification factor and the offset amount in the amplifier 23 based on the voltage detection result by the first voltage detection unit 13. The third voltage detection unit 15 needs to measure minute AC voltage in order to measure the AC impedance with high precision. Therefore, the DC value is subtracted from the output voltage of the filter 22 corresponding to the voltage of the predetermined battery cell Cb, and then amplified to improve the S/N ratio, which is the signal-to-noise ratio. The DC value of the predetermined battery cell Cb can be obtained based on the voltage detection result by the first voltage detection unit 13. Therefore, the offset control unit 26 controls the amplification factor and the amount of offset in the amplifier 23 in consideration of such points.

The ADC 20 A/D-converts the voltage output from the amplifier 23 and outputs a digital signal obtained as a result of the conversion. The voltage detection operation by the third voltage detection unit 15 configured as described above is performed when the impedance is calculated. A digital signal output from the ADC 20 is provided to the orthogonal lock-in detection unit 27. The orthogonal lock-in detection unit 27 is supplied with the SIN wave signal and the COS wave signal output from the SIN/COS generation unit 28.

The SIN/COS generation unit 28 generates and outputs a SIN wave signal and a COS wave signal, which are alternating current signals having a desired frequency, based on commands given from the control unit 12. The orthogonal lock-in detection unit 27 is, for example, a lock-in amplifier, and detects the real part and the imaginary part of the digital signal output from the ADC 20, that is, the digital signal corresponding to the voltage detection values of the plurality of battery cells Cb. A signal representing the detection result by the orthogonal lock-in detection unit 27 is provided to the control unit 12. Based on the signal output from the orthogonal lock-in detection unit 27, the control unit 12 acquires the detected value of the voltage of each battery cell Cb for use in calculating the impedance.

The drive control unit 29 controls the driving of the switching element 7 so that an alternating current having a desired frequency, that is, an excitation current is applied to the assembled battery 2. The drive control unit 29 constitutes a current application unit 30 that applies an alternating current to the assembled battery 2, together with the load element 6, the switching element 7, and the shunt resistor Rsh, which are the external elements described above. A SIN wave signal or a COS wave signal output from the SIN/COS generation unit 28 is supplied to the drive control unit 29. The drive control unit 29 generates a drive signal for driving the switching element 7, that is, an excitation signal, based on the SIN wave signal or the COS wave signal. In this case, the drive signal is a rectangular wave signal. A drive signal output from the drive control unit 29 is applied to the gate of the switching element 7 via the terminal 8.

The ADC 31 A/D converts the terminal voltage of the shunt resistor Rsh input via the filter 11 and the terminals 9 and 10, and outputs a digital signal obtained as a result of the conversion. A digital signal output from the ADC 31 is provided to the orthogonal lock-in detection unit 32. The ADC 31 and the orthogonal lock-in detector 32 constitute a current detection unit 33 that detects the current flowing through the plurality of battery cells Cb based on the terminal voltage of the shunt resistor Rsh.

The orthogonal lock-in detection unit 32 is, for example, a lock-in amplifier, and detects the real part and the imaginary part of the digital signal output from the ADC 31, that is, the digital signal corresponding to the detection values of the current flowing through the plurality of battery cells Cb. A signal representing the detection result by the orthogonal lock-in detection unit 32 is provided to the control unit 12. Based on the signal output from the orthogonal lock-in detection unit 32, the control unit 12 acquires the detected value of the current of each battery cell Cb for use in calculating the impedance.

The control unit 12 calculates the impedance of the battery cell Cb based on the voltage detection value of each battery cell Cb and the current detection value of each battery cell Cb obtained as described above, that is, based on the voltage values of the plurality of battery cells Cb detected by the third voltage detection unit 15 and the current values of the plurality of battery cells Cb detected by the current detection unit 33. In this case, the control unit 12 constitutes a calculation unit 34 together with the current detection unit 33.

As described above, in the battery monitoring device 1 of the present embodiment, the first voltage detection unit 13, the second voltage detection unit 14, part of the third voltage detection unit 15, the calculation unit 34, and the like are built in the battery monitoring IC 3, so that they constitute as an IC. Further, in the configuration of the present embodiment, a part of the third voltage detection unit 15, specifically, the capacitor Czb constituting the filter 22 provided in the third voltage detection unit 15, is an external capacitor provided outside the battery monitoring IC 3.

<Specific Configuration of Drive Control Unit>

Figure 2:
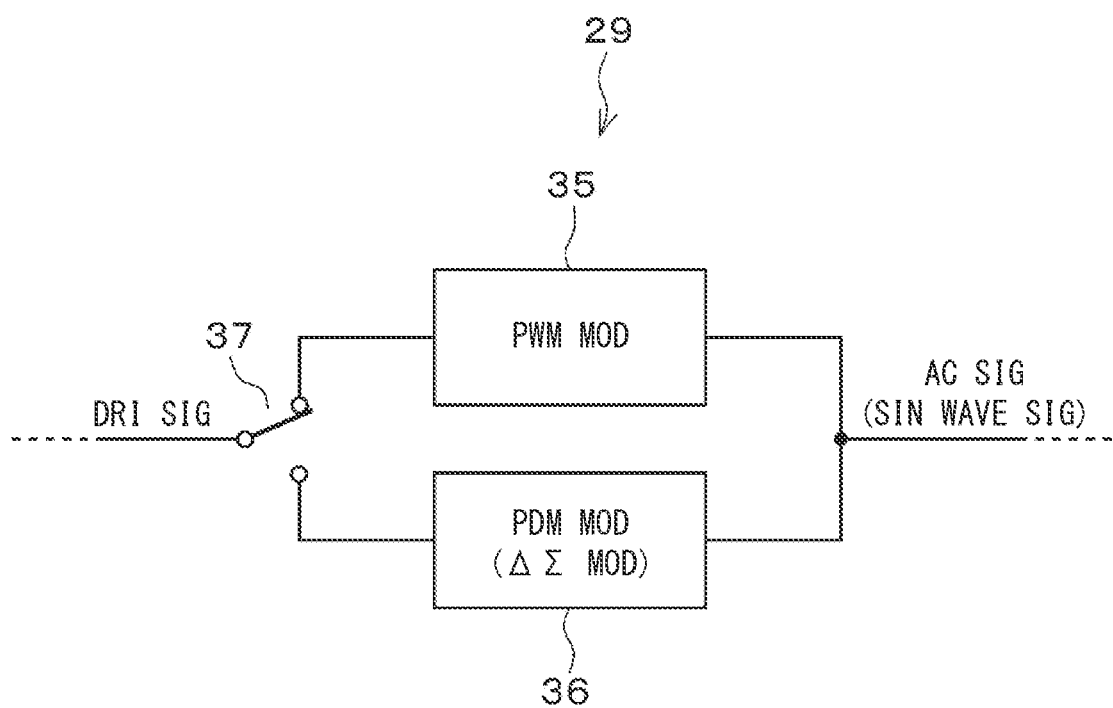
FIG. 2 is a diagram showing a specific configuration example of a drive control unit according to the first embodiment.

The following describes the concrete configuration of the drive control unit 29 by adopting, for example, the configuration illustrated in FIG. 2. As shown in FIG. 2, the drive control unit 29 includes a PWM modulator 35, a PDM modulator 36 and a switching unit 37. As described above, the drive control unit 29 is supplied with the SIN wave signal or the COS wave signal, which are AC signals output from the SIN/COS generation unit 28. Here, the drive control unit 29 receives the SIN wave signal.

Figure 3:
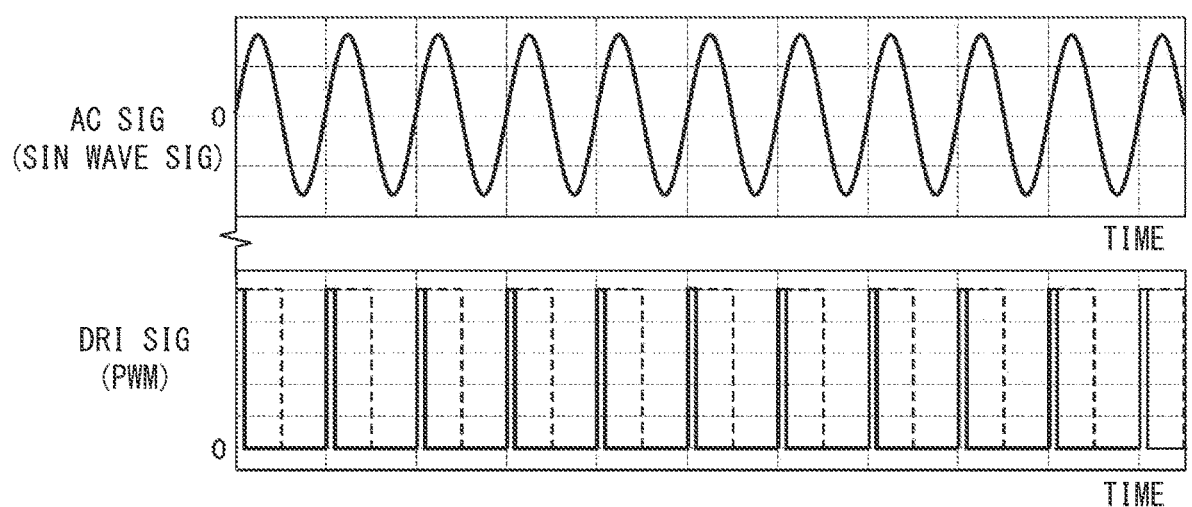
FIG. 3 is a diagram showing an example of an AC signal and a drive signal generated by a PWM modulator according to the first embodiment.

The PWM modulator 35 generates a drive signal for driving the switching element 7 by pulse width modulating the SIN wave signal. PWM is an abbreviation for Pulse Width Modulation. The driving signal generated by the PWM modulator 35 is a signal whose pulse width changes according to the amplitude of the SIN wave signal, for example, as shown in FIG. 3, and is input to the switching unit 37.

Figure 4:
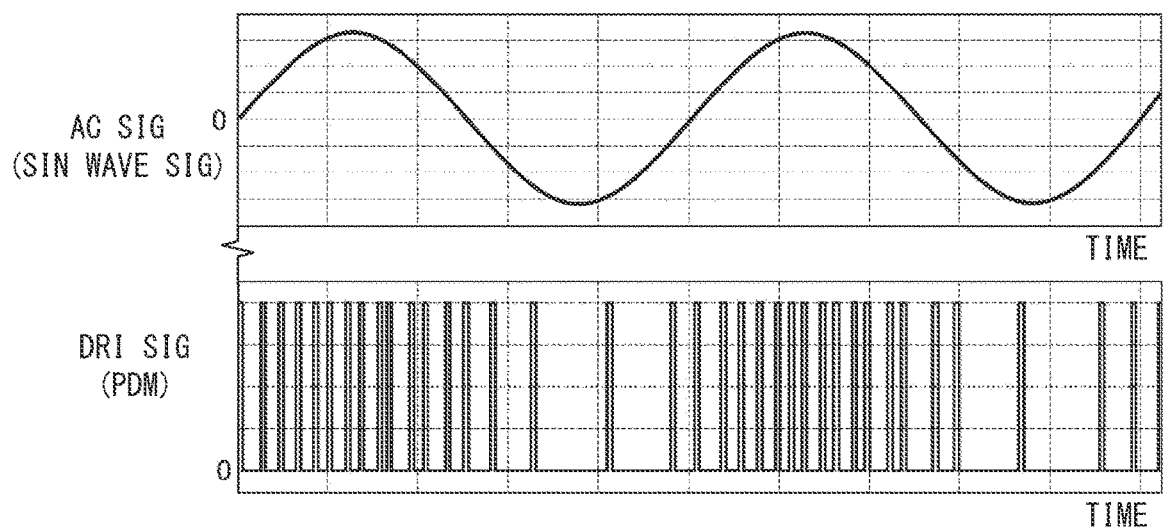
FIG. 4 is a diagram showing an example of an AC signal and a drive signal generated by a PDM modulator according to the first embodiment.

The PDM modulator 36 is a delta-sigma modulator, and generates a drive signal by pulse density modulating a sine wave signal. PDM is an abbreviation for Pulse Density Modulation. The drive signal generated by the PDM modulator 36 is a signal whose pulse density varies according to the amplitude of the SIN wave signal, as shown in FIG. 4, and is input to the switching unit 37. In this case, the drive signal generated by the PDM modulator 36 is a Return to Zero signal. In this specification, Return to Zero may be abbreviated as RZ.

The switching unit 37 selects and outputs one of the drive signal generated by the PWM modulator 35 and the drive signal generated by the PDM modulator 36. The switching unit 37 switches between a first drive state in which the switching element 7 is driven by the drive signal generated by the PWM modulator 35 and a second drive state in which the switching element 7 is driven by the drive signal generated by the PDM modulator 36. The switching of the driving state by the switching unit 37 may be performed based on the following concept.

That is, when calculating the impedance of the battery cell Cb, the drive control unit 29 controls the driving of the switching element 7 so that an alternating current having a desired frequency is applied to the assembled battery 2. Here, the frequency of the alternating current is swept in a range from 10 Hz to 5 kHz, for example. Therefore, the frequency of the AC signal, which is the SIN wave signal or the COS wave signal, is also swept, i.e., changed, in the range of 10 Hz to 5 kHz, like the AC current. the PWM and the PDM have the following characteristics. First, the switching frequency of ON/OFF switching of the switching element 7 is lower in the PWM than in the PDM. Further, it is easier to secure the minimum pulse width in the PWM, but it is difficult in the PDM to secure the minimum pulse width at high frequencies, which are relatively high frequencies. In addition, the period during which the drive signal is at a high level is difficult to become long in the PDM, and becomes long in low frequency, which is a relatively low frequency, in the PWM.

When the frequency of the alternating current is a relatively high frequency close to 5 kHz, if the switching element 7 is frequently switched on and off as in the PDM, power consumption increases and operation within a safe range becomes difficult. In addition, at high frequencies, the PDM should have a pulse width that suppresses ringing, and requires a pulse with a frequency about 100 times higher than that of the AC signal, so the pulse width should be narrow, and it may not be possible to secure the minimum pulse width.

On the other hand, when the frequency of the alternating current is relatively low, close to 10 Hz, in the PWM, the period during which the drive signal is at a high level becomes long, and the heat generated by the load element 6 and the switching element 7 concentrates in terms of time, and thus, it becomes difficult to operate within a safe range, and fluctuations in element characteristics such as the resistance value of the load element 6 and the on-state resistance of the switching element 7 may reduce the accuracy of detecting the current value and, in turn, calculating the impedance.

Therefore, in this case, the switching unit 37 switches to the first drive state when the frequency of the SIN wave signal exceeds the predetermined threshold frequency, and switches to the second drive state when the frequency of the SIN wave signal is equal to or less than the threshold frequency. The threshold frequency is for setting a boundary between high frequencies, which are relatively high frequencies near 5 kHz, and low frequencies, which are relatively low frequencies near 10 Hz, and can be set to any value. The threshold frequency can be set according to the specifications of the battery monitoring device 1, for example, so that the above-described difficulties can be resolved to a desired extent.

<Specific Configuration of Orthogonal Lock-In Detection Unit>

Figure 5:
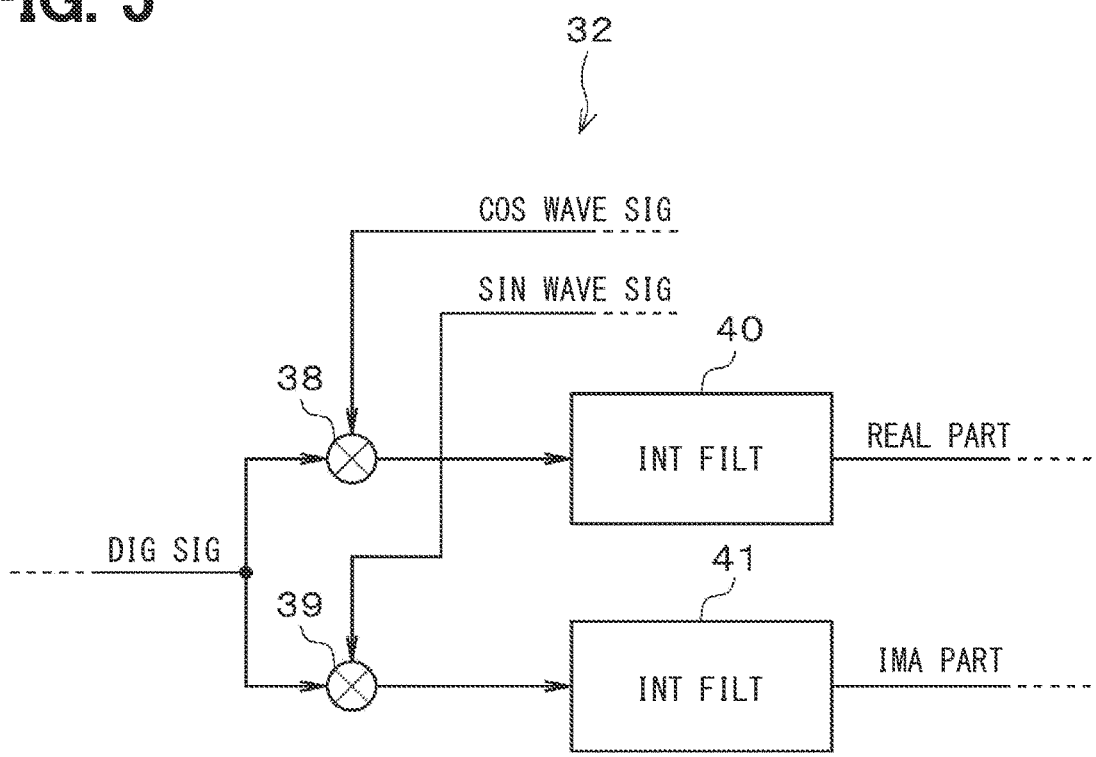
FIG. 5 is a diagram showing a specific configuration example of an orthogonal lock-in detection unit according to the first embodiment.
Figure 6:
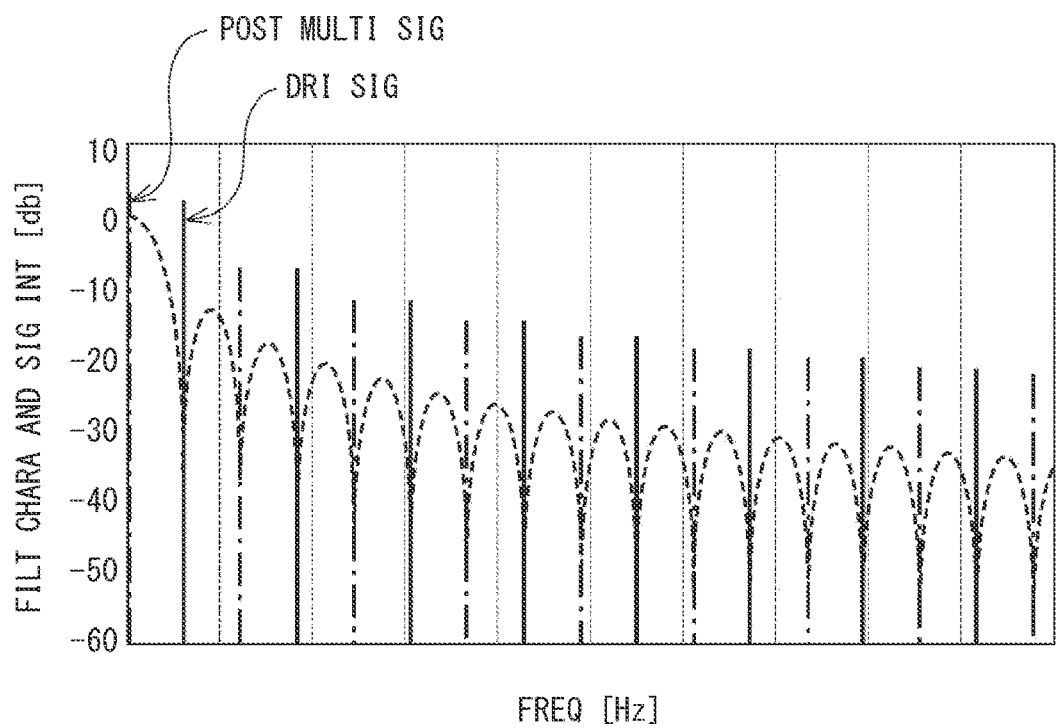
FIG. 6 is a diagram showing an example of the characteristic of the integration filter and the spectrum of the drive signal according to the first embodiment.

As a specific configuration of the orthogonal lock-in detection unit 32, for example, a configuration as shown in FIG. 5 may be adopted. As for the specific configuration of the orthogonal lock-in detection unit 27, a configuration similar to that of the orthogonal lock-in detection unit 32 may be adopted. As shown in FIG. 5, the orthogonal lock-in detection unit 32 includes multipliers 38 and 39 and integration filters 40 and 41 which are digital filters. A digital signal output from the ADC 31 is input to one input terminal of each of the multipliers 38 and 39.

The COS wave signal output from the SIN/COS generation unit 28 is input to the other input terminal of the multiplier 38. The SIN wave signal output from the SIN/COS generation unit 28 is input to the other input terminal of the multiplier 39. Each output signal of the multipliers 38 and 39, that is, each post-multiplication signal is input to the integration filters 40 and 41, respectively. The output signal of the integration filter 40 is a signal representing the real part of the digital signal output from the ADC 31, that is, a signal corresponding to the detected value of the current flowing through the plurality of battery cells Cb. The output signal of the integration filter 41 is a signal representing the imaginary part of the digital signal output from the ADC 31, that is, a signal corresponding to the detected value of the current flowing through the plurality of battery cells Cb.

According to the above configuration, the orthogonal lock-in detection uit 32 generates two post-multiplication signals by multiplying the digital signal output from the ADC 31 by the SIN wave signal and the COS wave signal, respectively, and detects the real part and the imaginary part of the signal corresponding to the detected value of the current flowing through the plurality of battery cells Cb by integrating each post-multiplication signal through integration filters 40 and 41.

In the configuration of the present embodiment, the driving signal for driving the switching element 7 is a rectangular wave, and therefore harmonic components may be generated. Such harmonic components may lead to detection errors. Therefore, in this embodiment, the integration filters 40 and 41 are improved as follows to attenuate the harmonic components and improve the S/N ratio. That is, the integration filters 40 and 41 have filter characteristics as indicated by dashed lines in FIG. 6. That is, the integration filters 40 and 41 are notch filters having notches, that is, bandstop filters.

Further, as shown in the following equation (1), the component xSquare(t) of the drive signal, which is a rectangle wave, includes harmonic components.

$$x_{square}(t) = 4/\pi \Sigma_{k=1}^{\infty} \sin\{(2k-1)2\pi ft\}/2k-1$$

In the present embodiment, based on the above points, the operation period of the integration filters 40 and 41 is an integer multiple of the fundamental period of the drive signal, that is, the period of the sine wave signal or the COS wave signal which is the original signal for generating the drive signal. By the above described feature, as shown by a solid line in FIG. 6, the high frequency components of the drive signal match the notches of the integration filters 40 and 41, and, as shown by a dashed line in FIG. 6, the harmonic components of the post-multiplication signal match the notches of the integration filters 40 and 41, so that a large attenuation characteristic is obtained.

In addition, since the integration filters 40 and 41 are digital filters, it is easy to dynamically change the operation cycle thereof. As described above, when calculating the impedance of the battery cell Cb, the frequency of the SIN wave signal or the COS wave signal is swept between 10 Hz and 5 kHz, so the fundamental period of the drive signal also changes similarly. Therefore, by changing the period of the integral filters 40 and 41 in accordance with the change in the fundamental period of the drive signal, it is possible to always obtain a large attenuation characteristic.

The above-described embodiment provides the following effect.

According to the configuration of the present embodiment, the second voltage detector 14 is provided in addition to the first voltage detection unit 13, as a configuration for detecting the voltages of the plurality of battery cells Cb in order to estimate the SOC of each battery cell Cb, perform equalization processing, and the like, so that redundant monitoring of the voltage of the battery cell Cb is possible. In this case, the first voltage detection unit 13 is configured to detect the voltage of each battery cell Cb via the filter 4 configured by the resistor Rp and the capacitor Cp. Also, in this case, the second voltage detection unit 14 is configured to detect the voltage of each battery cell Cb via the filter 5 configured by the resistor Rs and the capacitor Cs.

Therefore, in the above configuration, the filters 4 and 5 of the first voltage detection unit 13 and the second voltage detection unit 14 can be configured to have the same cutoff frequency without being affected by each other. Therefore, according to the present embodiment, detection errors in each voltage detection by the first voltage detection unit 13 and the second voltage detection unit 14 are reduced, and as a result, redundant monitoring of voltage detection of the battery cell Cb is performed with high accuracy. Thus, the excellent effects are obtained.

Further, in the above configuration, the third voltage detection unit 15, which performs voltage detection for impedance calculation, detects the voltage of each battery cell Cb through a detection path different from that of the first voltage detection unit 13 and the second voltage detection unit 14. Therefore, in the above configuration, the filter 22 independent of the filters of the first voltage detection unit 13 and the second voltage detection unit 14 can be provided as the filter of the third voltage detection unit 15. In this way, the cutoff frequency of the filter 22 of the third voltage detection unit 15 and the cutoff frequencies of the filters 4 and 5 of the first voltage detection unit 13 and the second voltage detection unit 14 can be set independently. Therefore, according to the present embodiment, it is possible to obtain the excellent effect of being able to obtain appropriate filtering characteristics according to the application for each voltage detection.

In voltage detection for impedance calculation, not only amplitude accuracy but also phase accuracy is important. Therefore, if the cutoff frequency of the filter varies for each battery cell Cb, an error may occur in the amplitude and phase of the detected voltage. As a result, there may be a possibility that the calculation accuracy of the impedance is reduced. Therefore, in the battery monitoring device 1 of the present embodiment, the third voltage detection unit 15 includes the MUX 25 that receives the voltages of the connection terminals S1 to S25, and selects and output two voltages necessary for detecting the voltage of the battery cell Cb as the detection target among the input voltages, and a filter 22 having a resistor Rzb and a capacitor Czb to which the output voltage of the MUX 25 is input. Thus, the unit 15 detects the voltage of the battery cell Cb based on the output voltage of the filter 22.

In such a configuration, the third voltage detection unit 15 that detects voltage for impedance calculation detects the voltage of each battery cell Cb via the same filter 22. Therefore, according to the above configuration, since the cutoff frequency of the filter does not fluctuate for each battery cell Cb, errors in the amplitude and phase of the detected voltage are reduced, and as a result, good impedance calculation accuracy is maintained.

In the battery monitoring device 1 of this embodiment, the first voltage detection unit 13, the second voltage detection unit 14, the calculation unit 34, and the like are built in the battery monitoring IC 3, while the capacitor Czb for constituting the filter 22 of the third voltage detection unit 15 is an external element provided outside the battery monitoring IC 3. In this way, by integrating most of the circuits for realizing the functions of the battery monitoring device 1, the size of the device and the manufacturing cost can be reduced. Further, in this case, since the capacitor Czb is an external element, it is possible to use a relatively large capacitance value. Thus, it is easy to realize the capacitor Czb with a large amount of capacitance.

The third voltage detection unit 15 includes: the amplification unit 23 that receives the output voltage of the filter 22, adds an offset to the input voltage, and amplifies it; the ADC 20 that A/D converts the output voltage of the amplification unit 23; and the offset control unit 26 that controls the amplification factor and the amount of offset in the amplification unit 23 based on the voltage detection result of the first voltage detection unit 13. According to such a configuration, it is possible to preliminarily subtract the DC component that is unnecessary for the third voltage detection unit 15, and then amplify only the AC component. Therefore, according to the above configuration, the S/N ratio for noise in the integrated circuit can be improved, and variations in voltage detection can be reduced.

Further, in the battery monitoring device 1 according to the present embodiment, when an alternating current is passed through the assembled battery 2 for impedance calculation, it is possible to select one of the first drive state in which the switching element 7 is driven by a drive signal generated by pulse width modulating the alternating signal and the second drive state in which the switching element 7 is driven by a drive signal generated by pulse density modulating the alternating signal.

When the drive signal is generated by pulse-density modulating the AC signal, it becomes difficult for the pulses of the drive signal to converge in terms of time during low-frequency. Therefore, in the above configuration, by selecting the second drive state during low-frequency, it is possible to avoid the temporal concentration of pulses of the drive signal and thus to avoid the temporal concentration of heat generation. As a result, an excellent effect can be obtained in that the safety and calculation accuracy of the impedance calculation can be maintained satisfactorily. In addition, in the above configuration, by selecting the first drive state at high frequencies, it is possible to reduce the frequency of on/off switching of the switching element 7, thereby suppressing power consumption and ensuring a minimum pulse width.

A current detection unit 33 for calculating impedance includes an ADC 31 that A/D converts the terminal voltage of the shunt resistor Rsh, and an orthogonal lock-in detection unit 32. The orthogonal lock-in detection unit 32 multiplies the digital signal output from the ADC 31 by a SIN wave signal and a COS wave signal having the same frequency as the AC signal, respectively, thereby generating two post-multiplication signals, and detects the real part and imaginary part of the signal corresponding to the detected value of the current flowing through the plurality of battery cells Cb by integrating each of these two post multiplication signals through an integration filter 40, 41, respectively.

The drive signal includes harmonic components because it is a rectangular wave signal generated by either the PWM modulator 35 or the PDM modulator 36. The harmonic components included in such a drive signal may lead to a detection error in the orthogonal lock-in detection unit 32. Therefore, in the above configuration, the operation period of the integration filter 40, 41 is an integer multiple period of the AC signal. By doing so, it becomes possible to match the harmonic component with the notch of the integration filter 40, 41, and a large attenuation characteristic can be obtained. Therefore, according to the above configuration, it is possible to greatly attenuate the harmonic components of the drive signal that may cause a detection error, so that the S/N ratio of detection by the orthogonal lock-in detection unit 32 can be improved.

In this embodiment, the drive signal generated by the PDM modulator 36 is an RZ signal. In the following description, the drive signal generated by the PDM modulator 36 will be referred to as the PDM drive signal. By doing so, the following effects can be obtained as compared with the case where the PDM drive signal is a non-return to zero signal. In this specification, Non Return to Zero may be abbreviated as NRZ.

Figure 7:
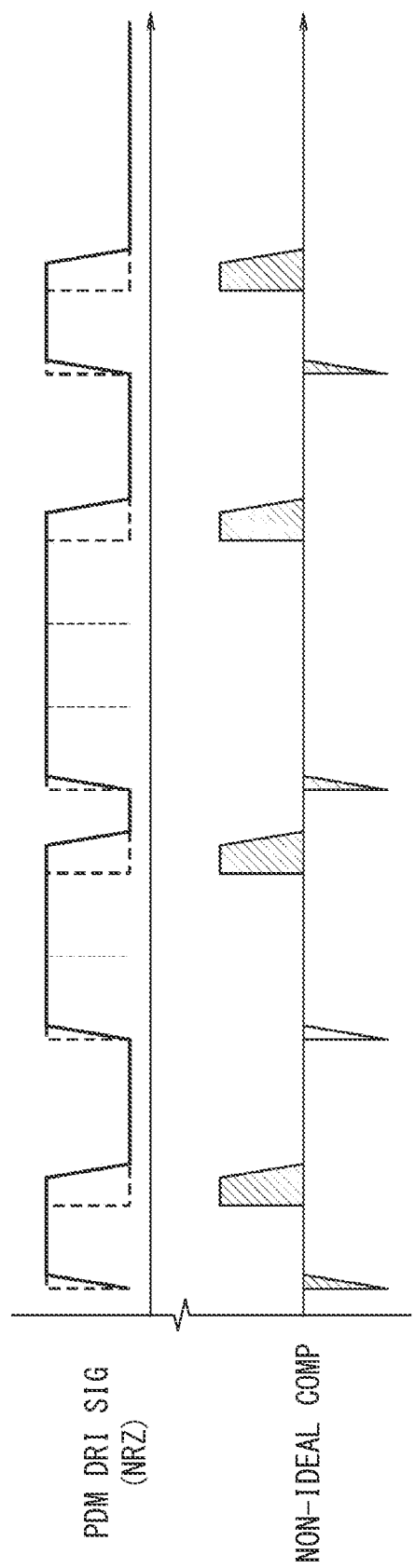
FIG. 7 is a diagram showing an example of waveforms of a drive signal of an NRZ signal generated by the PDM modulator and its non-ideal component according to the first embodiment.
Figure 8:
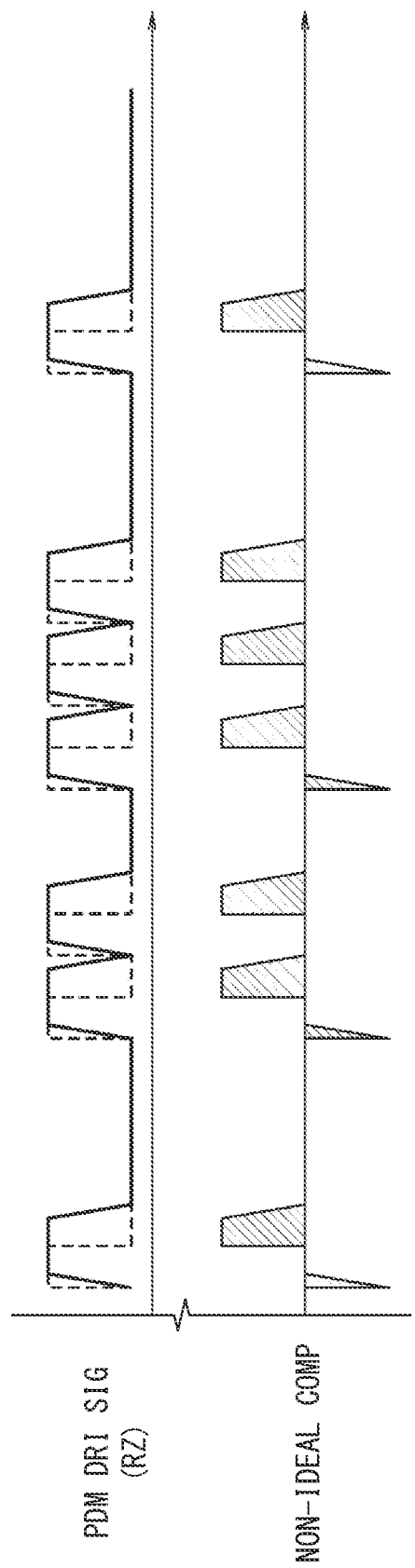
FIG. 8 is a diagram showing an example of waveforms of a drive signal of an RZ signal generated by the PDM modulator and its non-ideal component according to the first embodiment.

The waveform of the PDM drive signal that is the NRZ signal has a waveform as shown in the upper part of FIG. 7. In FIG. 7 and FIG. 8, which will be described later, the ideal waveform of the PDM drive signal is indicated by a dotted line, and its actual waveform is indicated by a solid line. As shown in FIG. 7, there is a difference between the actual waveform and the ideal waveform of the PDM drive signal, which is the NRZ signal, and non-ideal components exist according to the difference. As shown in the lower part of FIG. 7, the non-ideal component is proportional to the differential component of the drive signal and becomes random noise. That is, when the PDM drive signal is an NRZ signal, the inter-symbol interference occurs due to ringing, reduction in slew rate, duty ratio deviation, and the like, and the noise floor rises. As a result, the S/N ratio may deteriorate in the calculation of the impedance.

The waveform of the PDM drive signal that is the RZ signal has a waveform as shown in the upper part of FIG. 8. As shown in FIG. 8, there is a difference between the actual waveform and the ideal waveform of the PDM drive signal, which is the RZ signal, and non-ideal components exist according to the difference. However, in this case, as shown by the lower part in FIG. 8, the non-ideal component does not become floor noise because it has the same timing as the output. Therefore, when the RZ signal is used as the PDM drive signal, a good S/N ratio can be maintained in calculating the impedance.

Here, when the PDM drive signal is an RZ signal, the signal amplitude becomes smaller than when the PDM drive signal is an NRZ signal, and the number of switching times of the switching element 7 increases so that the power consumption is increased. Thus, these disadvantages may occur. Therefore, if the specification of the battery monitoring device 1 emphasizes these points rather than the S/N ratio in impedance calculation, the PDM signal may be an NRZ signal.

Second Embodiment

A second embodiment will be described below with reference to FIG. 9.

Figure 9:
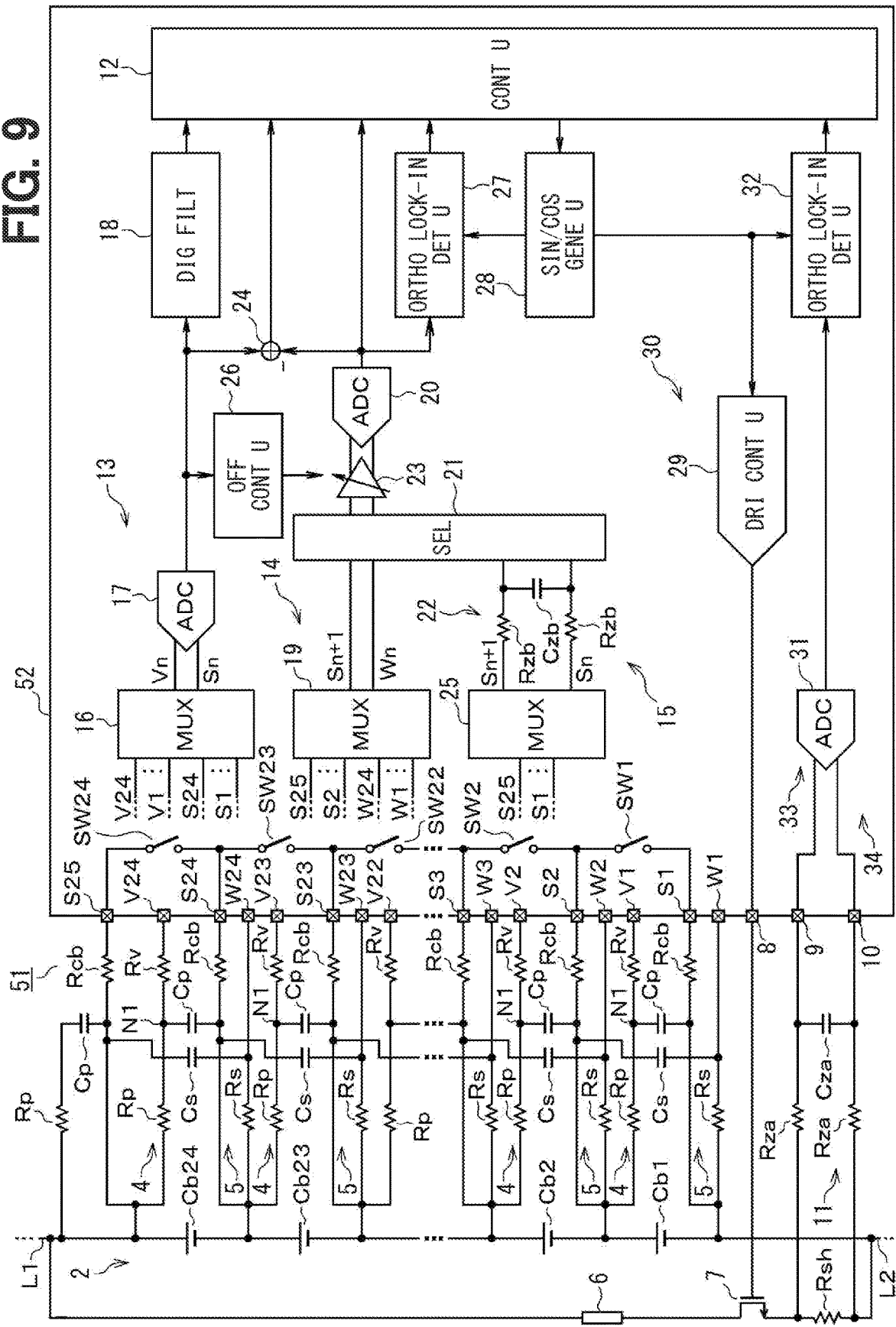
FIG. 9 is a diagram schematically showing the configuration of a battery monitoring device according to a second embodiment.

As shown in FIG. 9, the battery monitoring device 51 of the present embodiment differs from the battery monitoring device 1 of the first embodiment in that it includes a battery monitoring IC 6 instead of the battery monitoring IC 3. The battery monitoring IC 52 differs from the battery monitoring IC 3 in that the terminals C1 and C2 are omitted and the capacitance Czb is changed from an external element to an built-in element. That is, in the battery monitoring device 51 of this embodiment, the first voltage detection unit 13, the second voltage detection unit 14, the third voltage detection unit 15, and the calculation unit 34 are built in the battery monitoring IC 52, that is, configured as an IC.

The battery monitoring device 51 of this embodiment described above can also perform the same operation as the battery monitoring device 1 of the first embodiment. Thus, the same effect as the first embodiment can be achieved in the present embodiment. In addition, in the battery monitoring device 51 of the present embodiment, the capacitor Czb constituting the filter 22 of the third voltage detection unit 15 is also built in the battery monitoring IC 52. In this way, the device can be more integrated than the battery monitoring device 1 of the first embodiment, so that the size of the device and the manufacturing cost can be further reduced.

Third Embodiment

A third embodiment will be described below with reference to FIG. 10.

Figure 10:
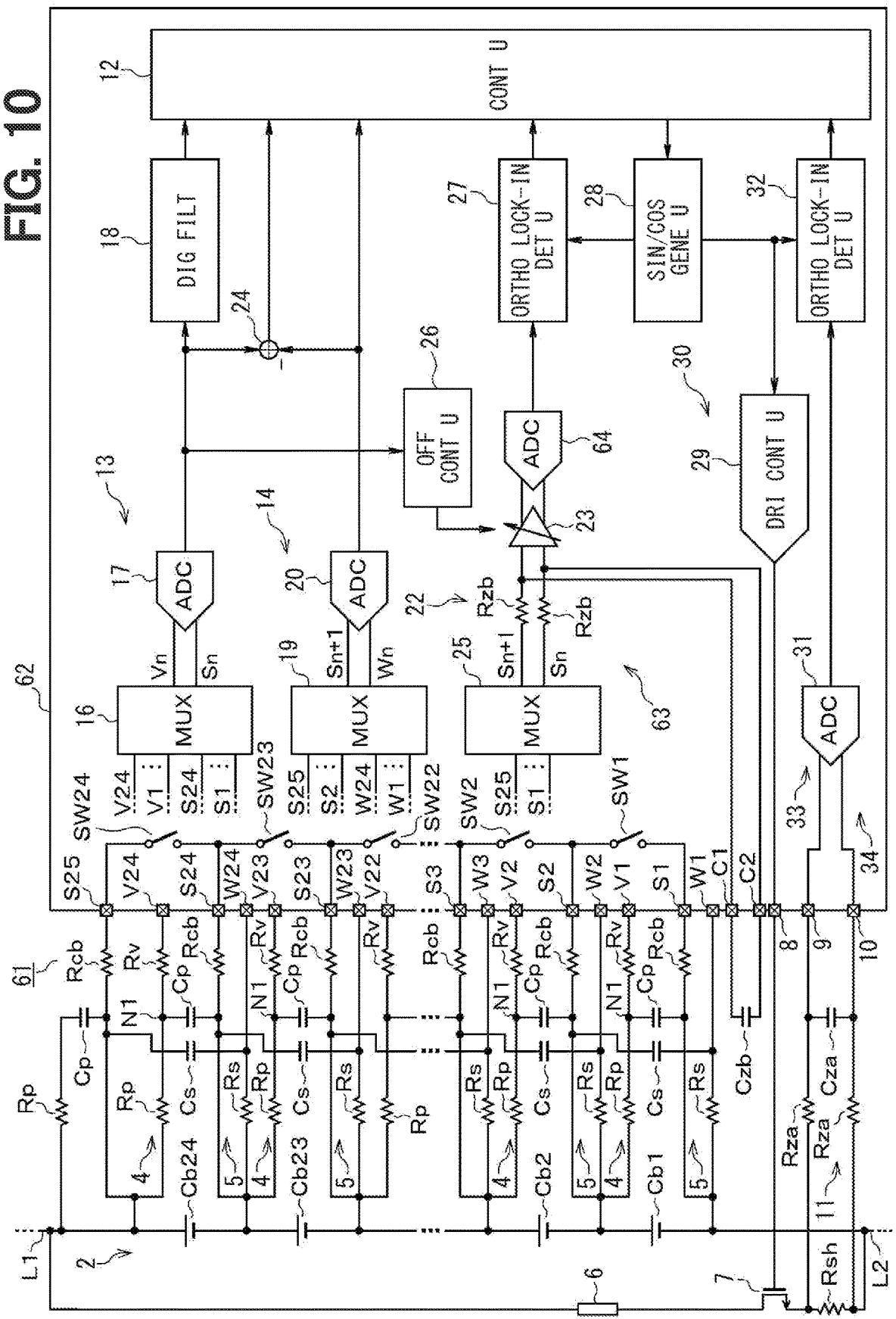
FIG. 10 is a diagram schematically showing the configuration of a battery monitoring device according to a third embodiment.

As shown in FIG. 10, the battery monitoring device 61 of the present embodiment differs from the battery monitoring device 1 of the first embodiment in that it includes a battery monitoring IC 62 instead of the battery monitoring IC 3. The battery monitoring IC 62 is different in that it includes a third voltage detection unit 63 instead of the third voltage detection unit 15 and that the selector 21 is omitted.

The third voltage detection unit 63 differs from the third voltage detection unit 15 in that, instead of sharing the ADC 20 with the second voltage detection unit 14, a dedicated ADC 64 is provided. In this case, the voltage output from the MUX 19 is directly input to the ADC 20 in the second voltage detection unit 14. Further, in this case, the output voltage of the filter 22 is input to the amplification unit 23 in the third voltage detection unit 63. The ADC 64 A/D-converts the voltage output from the amplifier 23 and outputs a digital signal obtained as a result of the conversion. A digital signal output from the ADC 64 is provided to the orthogonal lock-in detection unit 27.

The battery monitoring device 61 of this embodiment described above can also perform the same operation as the battery monitoring device 1 of the first embodiment. Thus, the same effect as the first embodiment can be achieved in the present embodiment. Further, according to the battery monitoring device 61 of the present embodiment, although the selector 21 is omitted from the battery monitoring device 1 of the first embodiment, the ADC 64, which requires a larger circuit area than the selector 21, is added. Thus, the circuit scale increases by the difference. However, according to the battery monitoring device 61 of the present embodiment, since the third voltage detection unit 63 is configured to detect voltage using the dedicated ADC 64, the voltage detection by the third voltage detection unit 63 can be performed at high speed. Thus, it is possible to improve the speed of the calculation of the impedance.

Fourth Embodiment

The following will describe a fourth embodiment with reference to FIG. 11 to FIG. 14.

Figure 11:
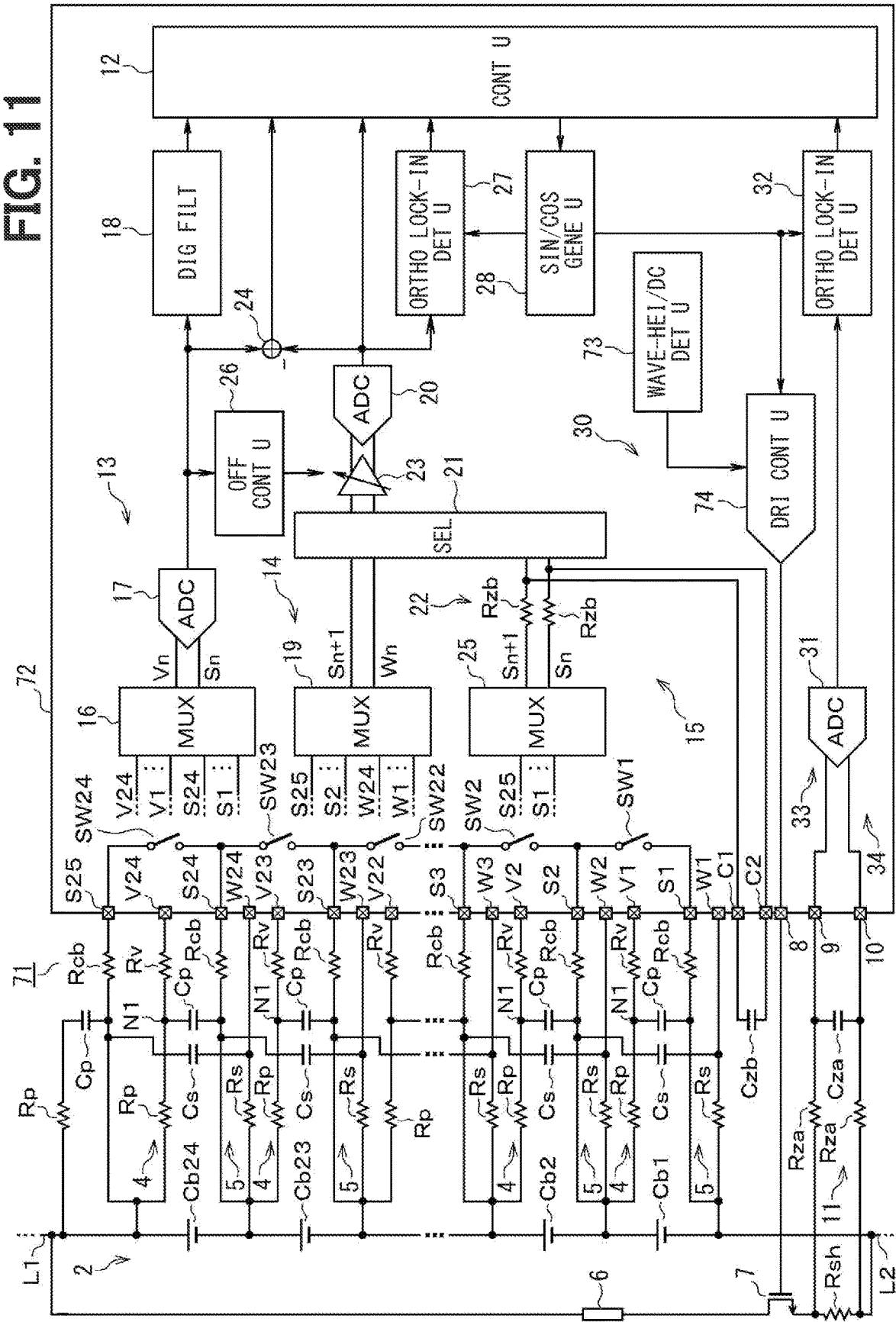
FIG. 11 is a diagram schematically showing the configuration of a battery monitoring device according to a fourth embodiment.

As shown in FIG. 11, the battery monitoring device 71 of the present embodiment differs from the battery monitoring device 1 of the first embodiment in that it includes a battery monitoring IC 72 instead of the battery monitoring IC 3. The battery monitoring IC 72 differs from the battery monitoring IC 3 in that a wave height/DC detection unit 73 is added, and a drive control unit 74 is provided instead of the drive control unit 29.

The wave height/DC detection unit 73 detects the wave height or DC wave height, i.e., the direct current component of the alternating current applied to the assembled battery 2 based on the digital signal output from the ADC 31, that is, the digital signal corresponding to the detected value of the current flowing through the plurality of battery cells Cb. The wave height/DC detector 73 outputs a signal representing the detected value of the DC component to the drive control unit 74. The drive control unit 74 has the same configuration as the drive control unit 29, but the operation of the switching unit 37 is different from that of the drive control unit 29.

In this case, the switching unit 37 detects the value of the DC component of the alternating current based on the signal output from the wave height/DC detection unit 73, in other words, based on the current detected by the current detection unit 33. The unit 37 switches the drive state based on the value of the detected DC component. Specifically, the switching unit 37 of the present embodiment switches to the second drive state when the DC component of the AC current exceeds a predetermined threshold current, and switches to the first drive state when the DC component of the AC current is equal to or less than the threshold current. It should be noted that the threshold current may be set to an arbitrary value that can solve the difficulty described later to a desired degree according to the specifications of the battery monitoring device 71, for example.

The battery monitoring device 71 of this embodiment described above can also perform the same operation as the battery monitoring device 1 of the first embodiment. Thus, the same effect as the first embodiment can be achieved in the present embodiment. Further, according to the battery monitoring device 71 of the present embodiment, the following effects are obtained. That is, conventionally, users for calculating the impedance have demanded that the S/N ratio should be improved to increase the calculation accuracy, and that power consumption during the calculation should be kept low.

However, in order to improve the calculation accuracy, it is necessary to increase the AC current applied to the assembled battery 2, which increases the power consumption. Also, in order to keep the power consumption small, it is necessary to reduce the alternating current applied to the assembled battery 2, which reduces the terminal voltage of the shunt resistor Rsh, resulting in lower calculation accuracy. In other words, each of these requirements has a trade-off relationship, so there is a difficulty to achieve both.

Figures 12, 13:
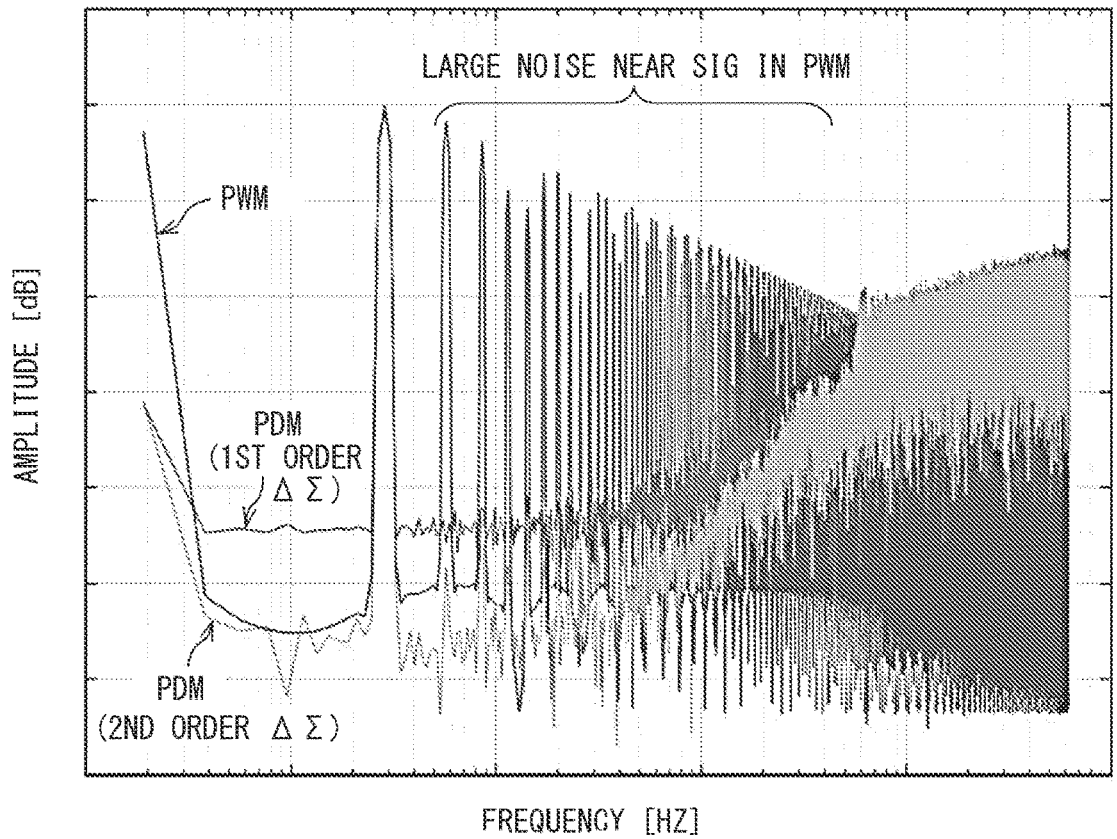
FIG. 12 is a diagram for explaining features of PWM and PDM.
FIG. 13 is a diagram showing an example of frequency spectra of PWM and PDM.
Figure 14:
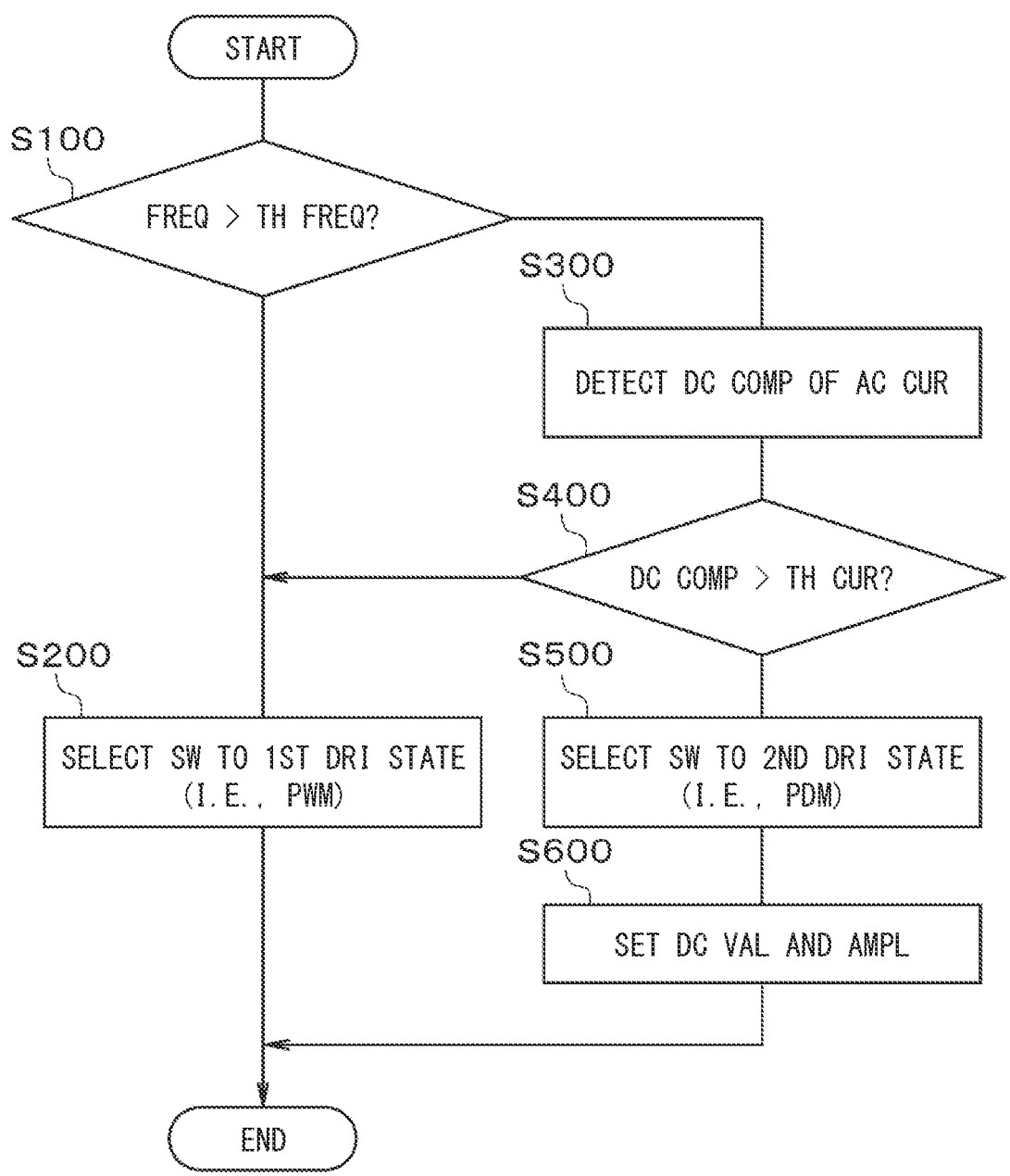
FIG. 14 is a diagram showing a flow of switching processing according to a modification of the fourth embodiment.

In this embodiment, in order to satisfy both of these requirements, the switching unit 37 switches the drive state based on the following concept. That is, the PWM and the PDM have characteristics as shown in FIG. 12. The maximum main signal amplitude corresponding to the amplitude of the alternating current applied to the assembled battery 2 is "$4/\pi > 1.273$" for the PWM and "1" for the PDM. Note that the maximum main signal amplitude is expressed as a ratio to the pulse height of the drive signal. Therefore, from the viewpoint of the maximum main signal amplitude, when the drive signal is generated by the PWM modulator 35, the S/N ratio can be increased compared to when the drive signal is generated by the PDM modulator 36.

By changing the pulse width, the PWM can reduce the DC component of the alternating current, that is, the DC current. On the other hand, in the PDM, the DC current can be easily reduced by changing the DC component and the amplitude of the SIN wave signal or COS wave signal, which are AC signals. Also, in the PDM, the DC current can be reduced by changing the pulse width of the drive signal, which is the RZ signal. Therefore, when the drive signal is generated by the PDM modulator 36, the DC current can be easily reduced compared to when the drive signal is generated by the PWM modulator 35.

The PWM and the PDM have different frequency spectra, as shown in FIG. 13. In the PWM, only odd-order harmonics are generated when the duty ratio is 50%, but not only odd-order harmonics but also even-order harmonics are generated when the duty ratio is 50% or less. Therefore, in the PWM, there may be a lot of noise in the vicinity of the signal. On the other hand, the PDM has much smaller harmonics than the PWM. Therefore, from the viewpoint of the frequency spectrum, when the drive signal is generated by the PDM modulator 36, the S/N ratio can be increased compared to when the drive signal is generated by the PWM modulator 35.

Further, in the configuration of this embodiment, the magnitude of the alternating current, more specifically the magnitude of the DC component of the alternating current, changes for the following reasons. That is, in this case, since the load element 6 is a PTC heater, its resistance value changes in proportion to the temperature. Therefore, the higher the temperature in the vicinity of the load element 6, the greater the resistance value of the load element 6, and the lower the temperature in the vicinity of the load element 6, the smaller the resistance value of the load element 6.

Considering these points, the switching unit 37 of the present embodiment switches between the first driving state and the second driving state based on the magnitude of the alternating current in order to satisfy the two requirements described above. Specifically, when the DC component of the AC current exceeds a predetermined threshold current, the switching unit 37 switches to the second drive state in which the switching element 7 is driven by the drive signal generated by the PDM modulator 36, and, when the DC component of the AC current is equal to or less than the threshold current, the switching unit 37 switches to the first drive state in which the switching element 7 is driven by the drive signal generated by the PWM modulator 35.

In this way, when the AC current is relatively small, the S/N ratio can be increased by the feature of the maximum main signal amplitude of the PWM. As a result, the calculation accuracy of the impedance is increased, and the power consumption in the calculation is suppressed to be low. In addition, when the AC current is relatively large, the DC current can be easily reduced by the PDM. As a result, it is possible to improve the accuracy of the impedance calculation and reduce the power consumption of the calculation. As described above, according to the present embodiment, it is possible to improve the S/N ratio and improve the calculation accuracy, and to reduce the power consumption during the calculation.

<Modification Example of Switching Unit>

The switching unit 37 is modified so as to perform switching processing that combines the switching based on the DC component of the AC current described in the present embodiment and the switching based on the frequency of the AC signal described in the first embodiment. Such switching processing will be described with reference to FIG. 14. First, in step S100, it is determined whether or not the frequency of the AC signal exceeds the threshold frequency. Here, if the frequency of the AC signal exceeds the threshold frequency, "YES" is determined in step S100, and the process proceeds to step S200. In step S200, switching to the first drive state using the PWM modulator 35 is selected. After execution of step S200, this processing ends, and various operations related to impedance calculation are started.

On the other hand, if the frequency of the AC signal is equal to or lower than the threshold frequency, the result is "NO" in step S100, and the process proceeds to step S300. In step S300, the DC component of the alternating current is detected. After execution of step S300, the process proceeds to step S400, and it is determined whether or not the DC component of the detected AC current exceeds the threshold current. Here, when the DC component of the detected AC current is equal to or less than the threshold current, "NO"

is determined in step S400, and the process proceeds to step S200. On the other hand, if the DC component of the detected AC current exceeds the threshold current, the result is "YES" in step S400, and the process proceeds to step S500.

In step S500, switching to the second drive state using the PDM modulator 36 is selected. After execution of step S500, the process proceeds to step S600, and the DC component of the AC signal, that is, the DC value and the amplitude are set according to the value of the detected DC component of the AC current. After execution of step S600, this processing ends, and various operations related to impedance calculation are started. According to such a modification, based on both the frequency of the AC signal and the DC component of the AC current, it is possible to select the optimum drive state between the first driving state using the PWM modulator 35 and the second driving state using the PDM modulator 36.

<Modification Example of Drive Control Unit>

The drive control unit 74 can be configured to generate a drive signal using the PWM modulator 35 or to generate a drive signal using the PDM modulator 36. In these modified examples, the switching unit 37 for switching between the first drive state and the second drive state is omitted. The drive control unit 74 of such a modified example detects the value of the DC component of the alternating current based on the signal output from the wave height/DC detection unit 73, in other words, based on the current detected by the current detection unit 33. The unit 74 performs the DC current control to adjust the DC component of the AC current, that is, the DC current, based on the value of the detected DC component. That is, the drive control unit 74 of the modified example is configured to perform DC current control for adjusting the DC component of the AC current applied to the assembled battery 2 by controlling the operation of the PWM modulator 35 or the PDM modulator 36.

Specific details of the DC current control by the drive control unit 74 of the modified example include, for example, the following. The drive control section 74 configured to generate the drive signal by the PWM modulator 35 can adjust the DC current by changing the pulse width. Further, the drive control unit 74 configured to generate the drive signal by the PDM modulator 36 can adjust the DC current by changing the DC component and the amplitude of the SIN wave signal or COS wave signal, which are AC signals. When the drive signal generated by the PDM modulator 36 is an RZ signal, the drive control unit 74 can adjust the DC current by changing the pulse width of the RZ signal.

Fifth Embodiment

A fifth embodiment will be described below with reference to FIG. 15.

Figure 15:
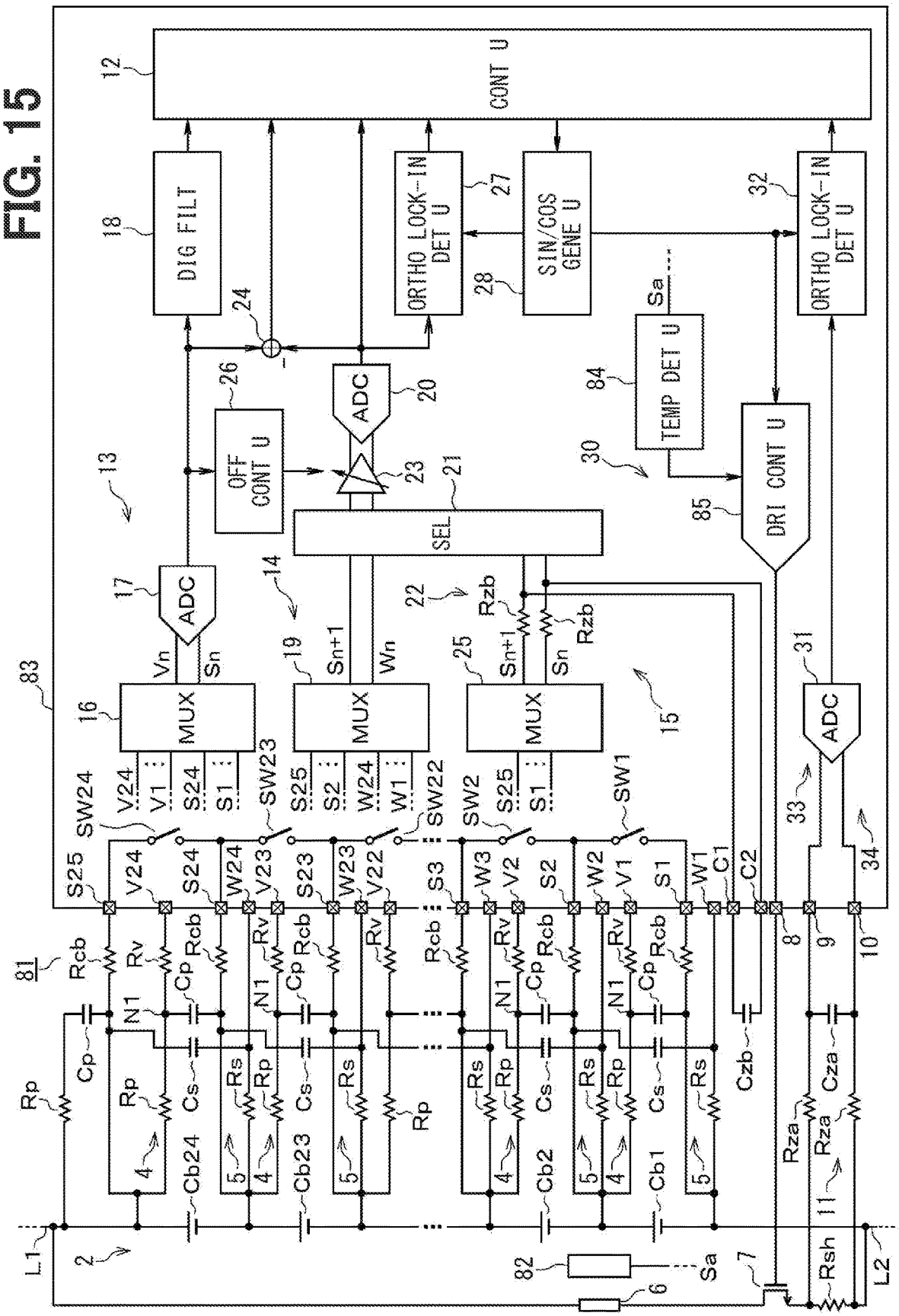
FIG. 15 is a diagram schematically showing the configuration of a battery monitoring device according to a fifth embodiment.

As shown in FIG. 15, the battery monitoring device 81 of the present embodiment is different from the battery monitoring device 1 of the first embodiment in that a battery monitoring IC 83 in place of the battery monitoring IC 3 is provided and a temperature sensor 82 is added. The temperature sensor 82 is provided near the load element 6 or the battery cell Cb, and outputs a temperature detection signal Sa corresponding to the temperature of the load element 6 or the battery cell Cb.

The battery monitoring IC 83 differs from the battery monitoring IC 3 in that a temperature detection unit 84 is added, and a drive control unit 85 is provided instead of the drive control unit 29. The temperature detection unit 84 detects the temperature of the load element 6 or the battery cell Cb based on the temperature detection signal Sa output from the temperature sensor 82. In this embodiment, the temperature sensor 82 is provided near the load element 6 and the temperature detection unit 84 detects the temperature of the load element 6. the temperature detection unit 84 outputs a signal representing the detected value of the temperature of load element 6 to drive control unit 85.

Since the temperature of the load element 6 has a correlation with the resistance value of the load element 6, the drive control unit 85 can calculate the resistance value of the load element 6 from the temperature of the load element 6. Further, since the battery monitoring device 81 measures the total voltage of the assembled battery 2, the drive control unit 85 can obtain the value of the total voltage. Even if the battery monitoring device 81 does not measure the total voltage of the assembled battery 2, the value of the total voltage can be obtained from the sum of the voltages of the battery cells Cb.

Therefore, the switching section 37 of the drive control section 85 estimates the DC component of the AC current based on the temperature detected by the temperature detection unit 84 and the total voltage of the assembled battery 2. The switching unit 37 of the present embodiment switches the driving state based on the DC component of the alternating current estimated in this way, like the switching unit 37 of the fourth embodiment. Thus, the same effect as the fourth embodiment can be achieved in the present embodiment.

Other Embodiments

The present disclosure is not limited to the embodiments that have been described above and illustrated in the drawings, but can arbitrarily be modified, combined, or expanded without departing from the spirit of the present disclosure.

The numerical values and the like shown in the embodiments described above are examples, and are not limited to those examples.

The amplifier 23 in the first and second embodiments is provided between the selector 21 and the ADC 20, that is in the latter stage of the selector 21. Alternatively, the amplifier 23 may be arranged between the filter 22 and the selector 21, that is, in the former stage of the selector 21.

In each of the above embodiments, the offset control unit 26 controls the amplification factor and the amount of offset based on the voltage detection result of the first voltage detection unit 13. Alternatively, in addition to, or in place of, it is also possible to control the amplification factor and the amount of offset based on the voltage detection result of the second voltage detection unit 14. That is, the offset control unit 26 can control the amplification factor and the amount of offset in the amplification unit 23 based on the voltage detection result of at least one of the first voltage detection unit 13 and the second voltage detection unit 14.

In each of the above-described embodiments, the two resistors Rzb forming the filter 22 are built in the IC, alternatively, they may be external elements outside of the IC. That is, all or a part of the two resistors Rzb and the capacitors Czb that form the filter 22 may be configured by external elements. In addition to the resistor Rzb and the capacitor Czb, if the resistor Rza and the capacitor Cza are built in the IC, all the elements that constitutes the filters 11 and 22 are provided on the same chip, so it is easy to match their characteristics.

The drive control unit 85 of the fifth embodiment may be modified in the same manner as the drive control unit 74 of the modification of the fourth embodiment. That is, the drive control unit 85 may be modified to perform the DC current control described in the modified example of the fourth embodiment based on the estimated value of the DC component of the alternating current.

In each of the above-described embodiments, the two resistors Rza and the capacitor Cza that constitute the filter 11 are external elements outside of the IC, alternatively, all or a part of them may also be built in the IC.

While the present disclosure has been described with reference to embodiments thereof, it is to be understood that the disclosure is not limited to the embodiments and constructions. The present disclosure incorporates various modifications and variations within the scope of equivalents. In addition, various combinations and forms, and further, other combinations and forms including only one element, or more or less than these elements are also within the sprit and the scope of the present disclosure.

What is claimed is:

1. A battery monitoring device for monitoring an assembled battery having a configuration in which a plurality of battery cells are connected in series, the battery monitoring device comprising:
    a first voltage detection unit that detects voltages of the plurality of battery cells;
    a second voltage detection unit that detects voltages of the plurality of battery cells for redundant monitoring;
    a current application unit that applies an alternating current to the assembled battery;
    a third voltage detection unit that detects voltages of the plurality of battery cells during a period in which the alternating current is applied to the assembled battery by the current application unit; and
    a calculation unit that calculates an impedance of the battery cells, wherein:
    the current applying unit includes:
    a load element, a switching element and a shunt resistor connected in series between both terminals of the assembled battery; and
    a drive control unit that controls driving of the switching element to apply the alternating current having a predetermined frequency to the assembled battery;
    the calculation unit includes a current detection unit that detects currents flowing through the plurality of battery cells based on a terminal voltage of the shunt resistor;
    the calculation unit calculates the impedance based on the voltages of the plurality of battery cells detected by the third voltage detection unit and the currents of the plurality of battery cells detected by the current detection unit; and
    the drive control unit includes:
    a PWM modulator that generates a drive signal for driving the switching element by pulse-width modulating an alternating current signal having a predetermined frequency;
    a PDM modulator that generates the drive signal by pulse-density modulating the alternating current signal having the predetermined frequency; and
    a switching unit that switches between a first drive state in which the switching element is driven by the drive signal generated by the PWM modulator and a second drive state in which the switching element is driven by the drive signal generated by the PDM modulator.

2. The battery monitoring device according to claim 1, wherein:
    the switching unit switches to the first drive state when a frequency of the alternating current signal exceeds a predetermined threshold frequency, and switches to the second drive state when the frequency of the alternating current signal is equal to or less than the predetermined threshold frequency.

3. The battery monitoring device according to claim 1, wherein:
    the switching unit switches to the second drive state when a direct current component of the alternating current applied to the assembled battery exceeds a predetermined threshold current, and switches to the first drive state when the direct current component of the alternating current is equal to or less than the predetermined threshold current.

4. The battery monitoring device according to claim 3, wherein:
    the switching unit detects the direct current component of the alternating current based on the currents detected by the current detection unit.

5. The battery monitoring device according to claim 3, further comprising:
    a temperature detection unit that detects a temperature of the load element or the battery cell, wherein:
    the switching unit estimates the direct current component of the alternating current based on the temperature detected by the temperature detection unit.

6. The battery monitoring device according to claim 1, wherein:
    the current detection unit includes:
    an A/D converter that A/D converts a terminal voltage of the shunt resistor; and
    an orthogonal lock-in detection unit that: multiplies a digital signal output from the A/D converter by a SIN wave signal and a COS wave signal having a same frequency as the alternating current signal, respectively, to generates two post-multiplication signals; and detects a real part and an imaginary part of a signal corresponding to a detected value of the currents flowing through the plurality of battery cells by integrating each of the two post-multiplication signals through an integration filter; and
    an operation period of the integration filter is an integer multiple of a period of the alternating current signal.

7. The battery monitoring device according to claim 1, wherein:
    the drive signal generated by the PDM modulator is a Return to Zero signal.

8. The battery monitoring device according to claim 1, further comprising:
    a first connection terminal that is arranged corresponding to each of the plurality of battery cells, and is connected to a low potential side terminal of one of the battery cells through a discharge resistor for discharging the battery cell;
    a second connection terminal that is connected to a high potential side terminal of a highest stage battery cell which is disposed on a highest potential side in the assembled battery through the discharge resistor;
    a third connection terminal that is arranged corresponding to each of the plurality of battery cells, and is connected to a high potential side terminal of one of the battery cells through a first filter resistor;
    a fourth connection terminal that is arranged corresponding to each of the plurality of battery cells, and is connected to a low-potential terminal of one of the battery cells through a second filter resistor;
    a first filter capacitor that is arranged corresponding to each of the plurality of battery cells, and is connected between the first connection terminal connected to one of the battery cells and the third connection terminal connected to the one of the battery cells; and a second filter capacitor that is arranged corresponding to each of the plurality of battery cells, wherein:

the second filter capacitor for one of the battery cells other than the highest stage battery cell is connected between the first connection terminal connected to an other one of the battery cells adjacent to an upper stage side of the one of the battery cells and the fourth connection terminal connected to the one of the battery cells;

the second filter capacitor for the highest stage battery cell is connected between the second connection terminal and the fourth connection terminal connected to the highest stage battery cell;

the first voltage detection unit detects a voltage of one of the battery cells as a detection target through the first connection terminal and the third connection terminal corresponding to the one of the battery cells;

the second voltage detection unit detects a voltage of one of the battery cells other than the highest stage battery cell as a detection target through the first connection terminal corresponding to an other one of the battery cells adjacent to an upper stage side of the one of the battery cells and the fourth connection terminal corresponding to the one of the battery cells;

the second voltage detection unit detects a voltage of the highest stage battery cell through the second connection terminal and the fourth connection terminal corresponding to the highest stage battery cell;

the third voltage detection unit detects a voltage of one of the battery cells other than the highest stage battery cell as a detection target through the first connection terminal corresponding to an other one of the battery cells adjacent to an upper stage side of the one of the battery cells and the first connection terminal corresponding to the one of the battery cells; and the third voltage detection unit detects a voltage of the highest stage battery cell through the second connection terminal and the first connection terminal corresponding to the highest stage battery cell.

9. The battery monitoring device according to claim 8, wherein:

the third voltage detection unit includes:

a multiplexer that inputs each voltage of the first connection terminal and the second connection terminal, and outputs selectively one of two input voltages necessary for detecting the voltage of one of the battery cells as a detection target; and a filter that has a resistor and a capacitor to which an output voltage of the multiplexer is input; and the third voltage detection unit detects the voltage of the one of the battery cells based on an output voltage of the filter.

10. The battery monitoring device according to claim 9, wherein:

at least the first voltage detection unit, the second voltage detection unit, and the calculation unit are configured by a semiconductor integrated circuit; and at least a part of the resistor and the capacitor constituting the filter is configured by an external element provided outside the semiconductor integrated circuit.

11. The battery monitoring device according to claim 9, wherein:

the third voltage detection unit further includes:

an amplifier that inputs the output voltage of the filter, adds an offset to an input voltage, and amplifying the input voltage;

an A/D converter that A/D converts an output voltage of the amplifier; and an offset control unit that controls an amplification factor and an offset amount in the amplifier based on a voltage detection result of at least one of the first voltage detection unit and the second voltage detection unit.

* * * * *